United States Patent [19]
Dingwall et al.

[11] Patent Number: 5,014,055
[45] Date of Patent: May 7, 1991

[54] ANALOG-TO-DIGITAL CONVERTER AND METHOD OF USE UTILIZING CHARGE REDISTRIBUTION

[75] Inventors: Andrew G. F. Dingwall, Princeton; Fu-Lung Hsueh, Plainsboro, both of N.J.

[73] Assignee: Harris Corporation, Melbourne, Fla.

[21] Appl. No.: 356,084

[22] Filed: May 24, 1989

[51] Int. Cl.$^5$ .............................................. H03M 1/36
[52] U.S. Cl. .................................... 341/159; 341/158
[58] Field of Search ............... 341/118, 122, 124, 155, 341/156, 158, 159, 172

[56] References Cited

U.S. PATENT DOCUMENTS

| | | | |
|---|---|---|---|
| 4,451,821 | 5/1984 | Domogalla | 341/158 |
| 4,570,121 | 2/1986 | Carbrey | 341/159 |
| 4,612,531 | 9/1986 | Dingwall et al. | 341/156 |
| 4,641,130 | 2/1987 | Mastroianni | 341/172 X |

Primary Examiner—A. D. Pellinen
Assistant Examiner—Brian K. Young
Attorney, Agent, or Firm—Henry I. Schanzer

[57] ABSTRACT

A twelve bit analog-to-digital converter uses two banks of 31 capacitors each coupled through separate control circuitry to a five bit analog-to-digital converter with plus or minus ½ bit accuracy and two separate eight bit analog-to-digital converters each having plus or minus ½ bit accuracy to achieve a frequency of operation from at least several MHz to up to about 40 MHz.

25 Claims, 11 Drawing Sheets

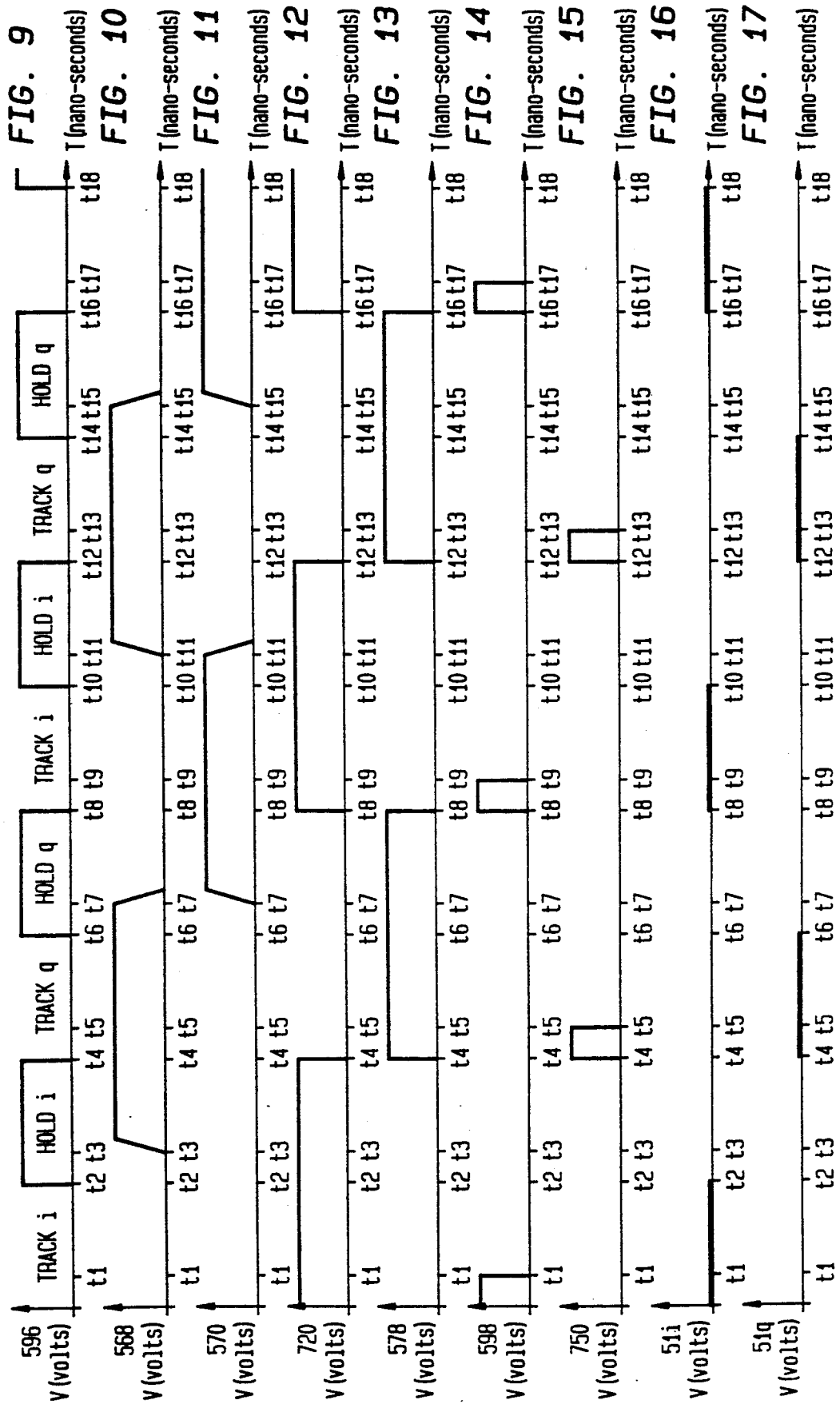

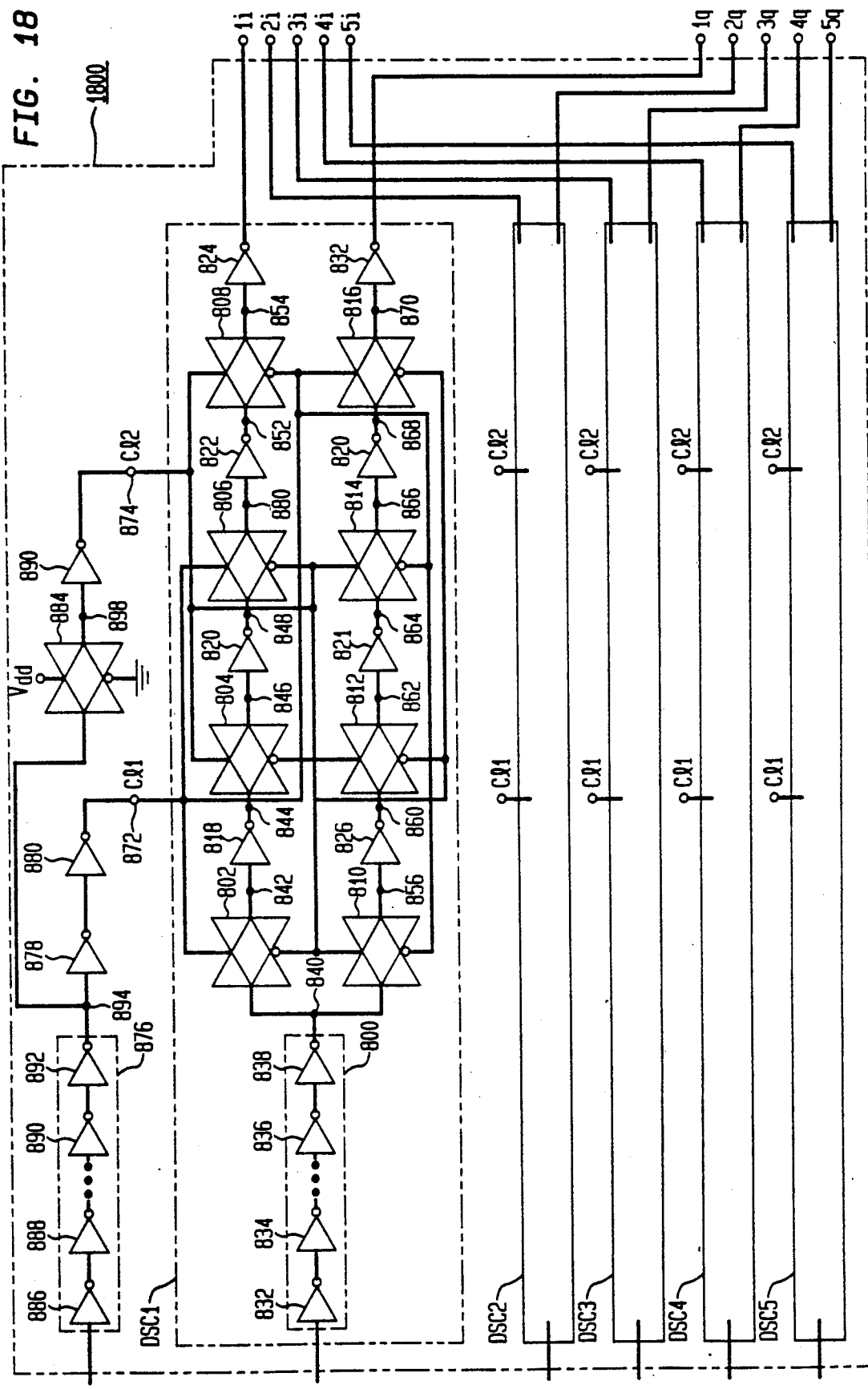

ANALOG-TO-DIGITAL CONVERTER AND METHOD OF USE UTILIZING CHARGE REDISTRIBUTION

FIELD OF THE INVENTION

This invention relates to analog to digital converters, hereinafter also referred to as A/D converters or ADCs.

BACKGROUND OF THE INVENTION

In a "flash"-type analog-to-digital converter the analog-to-digital conversion or comparison is ordinarily done in "parallel", i.e., in one step during one clock cycle. Flash-type analog to digital converters are known in the art, examples being the following:

637 Monolithic Expandable 6 Bit 20 MHZ CMOS/SOS A/D Converter", by Andrew G. F. Dingwall, IEEE Journal of Solid State Circuits, Vol, SC-14, no. 6, Dec. 1979, pp 926 to 932, herein after referred to as the Dingwall IEEE article.

Data Sheet for GE/RCA Models CA3318/CA3318A CMOS Video Speed 8 Bit Flash Analog-to-Digital Converter, published by and available from the manufacturer, herein after referred to as the CA3318 literature.

U.S. Pat. No. 4,612,531 Dingwall and Zazzu, "Intermeshed Resistor Network for Analog to Digital Conversion", issued on Sept. 16, 1986, herein after referred to as Dingwall and Zazzu.

Data sheet for Analog Devices Model CAV 1220 12 Bit Video Analog-to-Digital Converter contained in Analog Devices Databook, Copyright 1986, published by and available from the manufacturer, and herein after referred to as the CAV 1220 literature.

The "flash" type operation or parallel operation is in contrast to serial operation in which the comparisons or conversions are performed serially. The serial operation is necessarily much slower than the parallel operation and thus is not suitable for the high speed applications here contemplated.

The technology employed by the ADC of the Dingwall paper is silicon on sapphire (SOS) technology using complementary metal-oxide-silicon (CMOS) transistors. This is also the case for converters described in the CA3318 literature and in the Dingwall and Zazzu patent. In contrast, the technology employed in ADC of the CAV 1220 publication is essentially silicon using bipolar transistors in emitter-coupled-logic (ECL) configurations.

The Dingwall IEEE paper points that there are practical limits to the number of output bits that can be generated by a conventional flash-type x bit ADC, where x is the number of output bits. The number of comparators and the number of resistors in the resistive string (ladder) of the conventional ADC increases proportionally with the number of output bits. Assuming an available fixed reference potential is used across the resistor string, as the number of resistors increases, the voltage drop across each resistor decreases. This results in the comparators, which have a first input connected to the common node between adjacent resistors, needing to have increased sensitivity. In addition, the comparators draw some current out of the resistor string and introduce capacitive loading on the comparators. The presently accepted limiting value of the number of output bits of a flash type ADC is about eight. An 8 bit ADC typically requires a 256 resistor ladder and 255 comparators. The number of output bits determines the accuracy of the ADC. An 8 bit ADC is said to have 8 bit accuracy (one part in (256) A 12 bit ADC has 12 bit accuracy (one part in 4096).

Some applications require greater than eight bit accuracy. For example, for television video or radar application, twelve bit accuracy (one part in 4096) is typically needed; this is provided by the ADC described in the CAV 1220 literature and uses bipolar technology.

Another prior art solution used to obtain a twelve bit relatively fast and accurate ADC is to divide the ADC into two ADC's, the first being a five bit ADC and the second being an eight bit ADC with a needed subtraction function being accomplished by a 12 bit accuracy operational amplifier which has fast settling time. One of the bits of the 8 bit ADC is used for error correction such that the overall ADC has the five most significant bits generated by the first ADC and has the 7 least significant bits generated by the second ADC. One example of such an ADC is given in FIG. 1.

Referring now to FIG. 1, there is illustrated a prior art 12 bit Analog-to-Digital-Converter (ADC) 10. ADC 10 includes track circuitry 12 which has 12 bit accuracy, a capacitor C1, a clocked near unity gain buffer circuit 14, a 5 Bit Analog-to-Digital Convertor (ADC) 16 with an accuracy of plus or minus ½ least significant bit, an analog delay element 20, a digital delay element 23, error correction circuitry 24, a 5 bit Digital-to-Analog-Convertor (DAC) 26 with a 12 bit accuracy, a two input operational amplifier 28 characterized by 12 bit accuracy and fast settling time, an 8 bit Analog-to-Digital-Convertor (ADC) 29. Track circuitry 12 and capacitor C1 provide a track and hold function. ADC 16 includes a resistor string including resistors R1, R2, ... and R32, comparators 1, 2, ... and 31, first bar code to binary circuitry 18 and first latch circuitry 22. ADC 29 includes a resistor string and 255 comparators 30, a second bar code to binary circuitry 32, an inverter circuit 34, and second latch circuitry 36. ADC 10 receives an analog signal at an input terminal Vin and generates a 12 bit digital output signal having the five most significant bits MSB1, MSB2, MSB3, MSB4, MSB5 being generated at an output of error correction circuitry 24 and having the seven least significant bits LSB1, LSB2, LSB3, LSB4, LSB5, LSB6 and LSB7 generated at the output of latch circuitry 36.

An analog signal applied to input terminal Vin is allowed to selectively charge C1 to a potential level corresponding to the average voltage level of the input analog signal during a preselected time period. An output of unity gain buffer circuit 14 is coupled to an input of analog delay element 20 and to first inputs of each of comparators 1, 2, ... and 31. After C1 is so charged, buffer circuit 14 is then clocked on by a signal applied to a clock terminal 14a thereof. This allows the potential level of C1 to be coupled to an input of each of the 31 comparators of ADC 16 and to an input of the analog delay element 20. ADC 16 generates on output terminals of the comparators 1, 2, ... 31 an output bar code signal which is coupled to input terminals of bar code to binary circuitry 18. Bar code to binary circuitry 18 generates at five output terminals thereof, five output digital signals which are coupled to five input terminals of latch circuitry 22. Five output terminals of latch circuitry 22 are connected to five separate input terminals of DAC 26 and to five separate input terminals of error correction circuitry 24. Information from latch circuitry 22 coupled to DAC 26 and to error correction circuitry 24 when is appropriately conditioned by a clock signal applied to a clock terminal 22a thereof.

An output of DAC 26 is connected to a positive input terminal of operational amplifier 28. An output of analog delay element 20 is coupled to a negative input terminal of operational amplifier 28. An output of operational amplifier 28 is connected to a first input terminal of each of the 255 comparators of ADC 29.

Five Bit DAC 26, which has 12 bit accuracy, generates an analog signal from the five bit digital signals received from bar-code-to-binary circuitry 18 via latch circuitry 22. Operational amplifier 28 effectively subtracts with 12 bit accuracy the "range estimate" output of DAC 26 from the output of analog delay element 20 to generate at an output terminal thereof a resultant analog "residue" signal that serves as an input signal to ADC 29. The 255 comparators of ADC 29 output signals which are coupled to 255 inputs of bar code to binary circuitry 32. Bar code to binary circuitry 32 has eight output terminals. The first six outputs of bar code to binary circuitry 32 are connected to six input terminals of latch circuitry 36. The seventh output terminal of bar code to binary circuitry 32 is coupled to an input terminal of inverter circuit 34 which has an output connected to a seventh input of latch circuitry 36. The seventh and eighth outputs of bar code to binary circuitry 32 are connected to two inputs of overrange/underrange error correction circuitry 24.

ADC 10 generates a 12 bit output digital signal which is a digital representation of an analog signal applied to the input terminal Vin of ADC 10. At seven outputs of latch circuitry 36 there are generated the seven least significant bits LSB1, LSB2, LSB3, LSB4, LSB5, LSB6 and LSB7 of the desired 12 bit digital output signal of ADC 10. At five outputs of error correction circuitry 24 there are generated the five most significant bits, MSB1, MSB2, MSB3, MSB4, MSB5 of the desired 12 bit digital output signal ADC 10.

Track circuit 12 and DAC 26 must be of 12 bit accuracy and therefore they are relatively complex and expensive to construct. Operational amplifier 28 must also have 12 bit accuracy and must also have a fast settling time in order to allow high frequency operation of ADC 10. Operational amplifier 28 is typically relatively complex and relatively expensive to construct. Accordingly, it is desirable to be able to have a circuitry which performs the basic functions of track circuitry 12, capacitor C1, clocked unity gain buffer circuit 14, DAC 26, operational amplifier 28, and analog delay element 20 and which is significantly less complex and expensive. Another problem is that in order to get the accuracy needed by operational amplifier 28, it is typically fabricated using bipolar circuitry whereas most of the balance of ADC 10 can be fabricated from metal-oxide-semiconductor (e.g., silicon) (MOS) devices or complementary MOS (CMOS) devices. Since it is difficult to fabricate high performance bipolar and MOS devices on the same integrated circuit, operational amplifier 28 is typically formed on a separate integrated circuit than most other components of ADC 10. It is desirable to be able to construct most, if not all, of the components of a 12 bit fast ADC on one integrated circuit which uses MOS compatible technology.

SUMMARY OF THE INVENTION

One aspect of the invention is a combination which comprises an n bit analog-to-digital converter means and a capacitive means. An analog signal is applied to the n bit analog-to-digital converter means and to the capacitive means. The capacitive means stores the voltage level of the analog signal while the n bit analog-to-digital converter means converts the voltage level of the input analog signal to a digital output representation which is accurate to one part in $2^n$ parts. An output of the n bit analog-to-digital converter means is coupled to the capacitive means where it is subtracted from the stored voltage level to produce a difference signal. The capacitive means comprises a plurality of capacitors and the subtraction is accomplished by redistribution of charge on the capacitors.

Another aspect of the invention is the n bit analog-to-digital converter means, the capacitive means and an m bit analog-to-digital converter means with an output of the capacitive means coupled to the m bit analog-to-digital converter means so as to form an x bit analog-to-digital converter where $n+m=x$.

Still another aspect of the invention is an x bit analog-to-digital converter (ADC) comprising an n bit analog-to-digital converter, where n is less than x, a first capacitive subtraction means and a first m bit analog-to-digital converter. The n bit ADC has an input coupled to an input terminal of the x bit ADC and has outputs which are coupled to a first set of n output terminals of the x bit ADC. The first capacitive subtraction means, which is coupled to the input terminal of the x bit ADC and to the n bit ADC, selectively stores the voltage of an analog signal applied to the input terminal of the x bit ADC and subsequently subtracts from said voltage one voltage of a group of voltages which is determined by signals generated by the n bit ADC. The first set of n output terminals of the x bit ADC is adapted to provide n most significant bits of a digital output signal generated by the x bit analog-to-digital converter from an analog signal applied to the input terminal of the x bit ADC and the first set of m output terminals of the x bit ADC is adapted to provide m least significant bits of the digital output signal of the x bit ADC.

Still another aspect of the invention is an x bit analog-to-digital convertor (ADC) comprising a sample and hold circuit, an n bit analog-to-digital convertor (ADC), where n is less than x, a plurality of capacitors each having first and second terminals, switching means having first and second terminals, control circuitry having a plurality of inputs and outputs and an m bit analog-to-digital convertor (ADC), where $n+m=x$. The capacitors, switching means and control circuitry perform a subtraction function and a sample and hold function and may be denoted as capacitive subtraction means or as capacitive subtraction and sample and hold means.

An input of the sample and hold circuit is coupled to a x bit ADC input terminal which is also coupled to a first input of the control circuitry. The n bit ADC comprises a plurality of comparators each having a first input which is coupled to the output of the sample and hold circuit and further comprising a bar code to binary circuit having a separate input coupled to a separate output of each comparator and having n outputs which are coupled to n output terminals of the × bit ADC. The first terminal of the switching means is coupled to the second terminal of each of the capacitors and the second terminal of the switching means is connectable to a first reference voltage source.

The switch means is adapted to selectively couple the second terminals of the capacitors to the first reference voltage source and to selectively isolate same from the first voltage source. The second and higher inputs of the control circuitry are coupled to a separate one of outputs of the n bit ADC. The control circuitry is adapted such that selectively the first input thereof is coupled to the first terminals of the capacitors when the second terminals of the switching means is coupled to the first reference voltage. The outputs of the n bit ADC are coupled to and selectively control the control circuitry such that preselected voltages are applied to the first terminals of the capacitors to facilitate a subtraction function when the first and second terminals of the switching means are electrically isolated from each other. Input terminals of the m bit ADC are coupled to the second terminals of the capacitors. The m bit ADC has m outputs which are each coupled to a separate one of m output terminals of the x bit ADC. The output of the n bit ADC is adapted to provide n most significant bits of a digital output signal generated by the x bit ADC from an analog signal applied to the input terminal thereof and the output of the m bit ADC is adapted to provide m least significant bits of the digital output signal of the x bit ADC.

The switching means, capacitors and control circuitry, in addition to facilitating a needed subtraction function, act as a sample and hold circuit.

In a preferred embodiment the capacitors are all identical in capacitance and equal in number to the number of comparators of the n bit ADC. The output of each of the comparators of the n bit ADC is coupled to a separate one of the second and higher inputs of the control circuitry.

Another preferred embodiment includes all of the components of the first preferred embodiment and further comprises a second switching means, a second control circuitry, a second m bit ADC and two divide by two circuits.

In another embodiment there are n capacitors which are binary weighted and each of the second and higher inputs of the control circuitry is coupled to a separate one of outputs of the bar code to binary circuitry of the n bit ADC.

Still another aspect of the invention is a method of converting an analog signal to a digital representation thereof comprising the steps of selectively applying the analog signal to first terminals of a plurality of capacitors which have second terminals thereof selectively coupled to a fixed reference voltage to store the voltage level of a portion of the analog signal and applying the same analog signal to a first analog-to-digital convertor which generates at least one most significant bit of a digital representation of the analog signal; and coupling outputs of the first analog-to-digital convertor to first control circuitry which, in response to signals received from the first analog-to-digital convertor, causes one of a group of preselected voltages to be coupled to each of the first terminals of the first plurality of capacitors while the second terminals thereof are allowed to electrically float in potential so as to cause a redistribution of charge stored in the first plurality of capacitors such that an analog signal is generated at the second terminals of the first plurality of capacitors which is the difference between the originally stored voltage level and the subsequently supplied fixed voltages which are coupled to the first terminals of the first plurality of capacitors.

The invention will be better understood by consideration of the following more detailed specification of which the appended claims and abstract form a part, considered together with the accompanying drawings.

BRIEF DESCRIPTION OF THE DRAWINGS

FIGS. 9, 10, 11, 12, 13, 14, 15, 16 and 17 graphically show voltage waveforms versus time which are applied to and/or generated by the circuitry of FIG. 8; and FIG. 18 shows a preferred embodiment of the delay and separation circuitry of FIG. 7:

DETAILED DESCRIPTION

Figure 1:
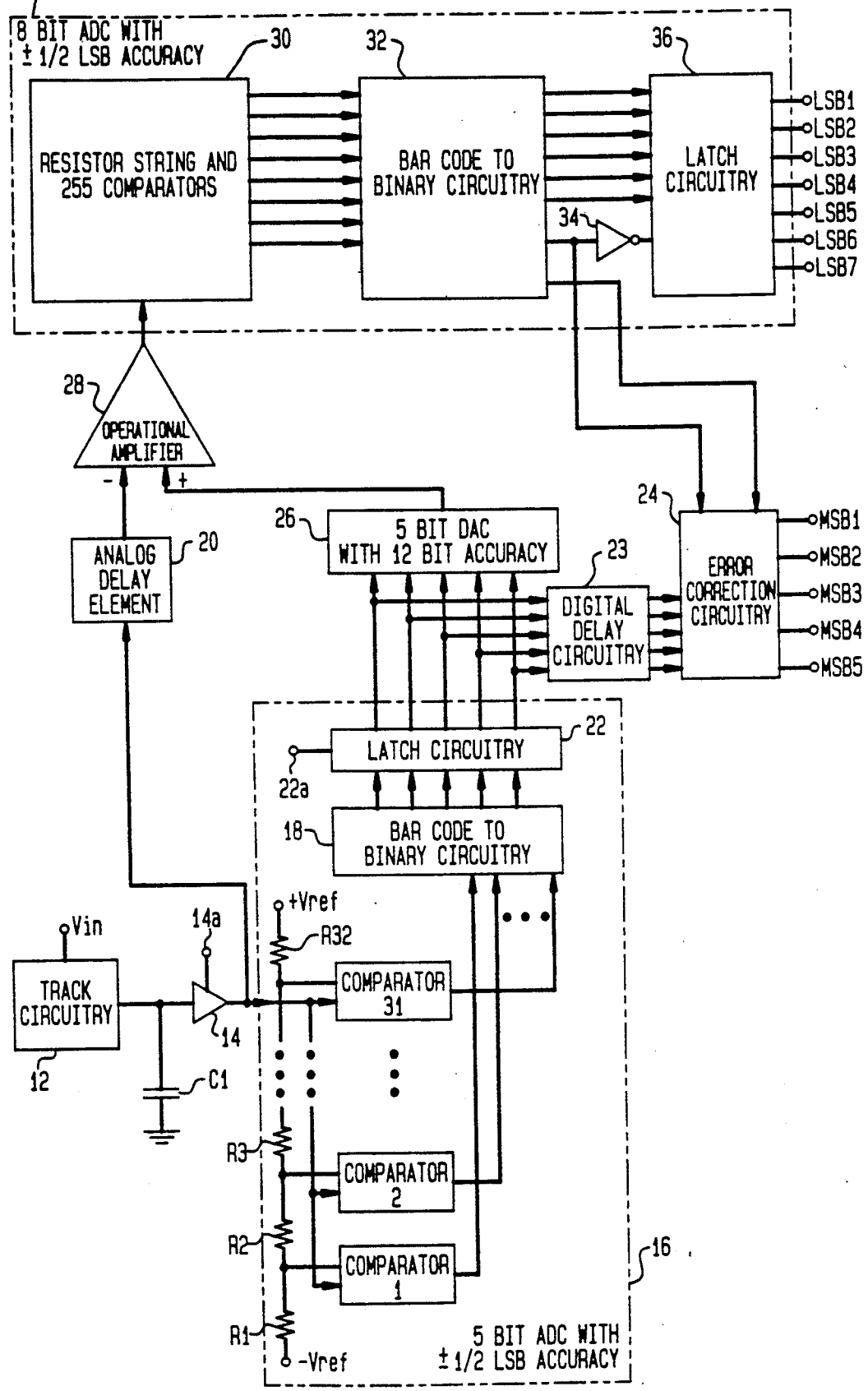
FIG. 1 shows a prior art 12 bit Analog-to-Digital Converter (ADC)
Figure 2:
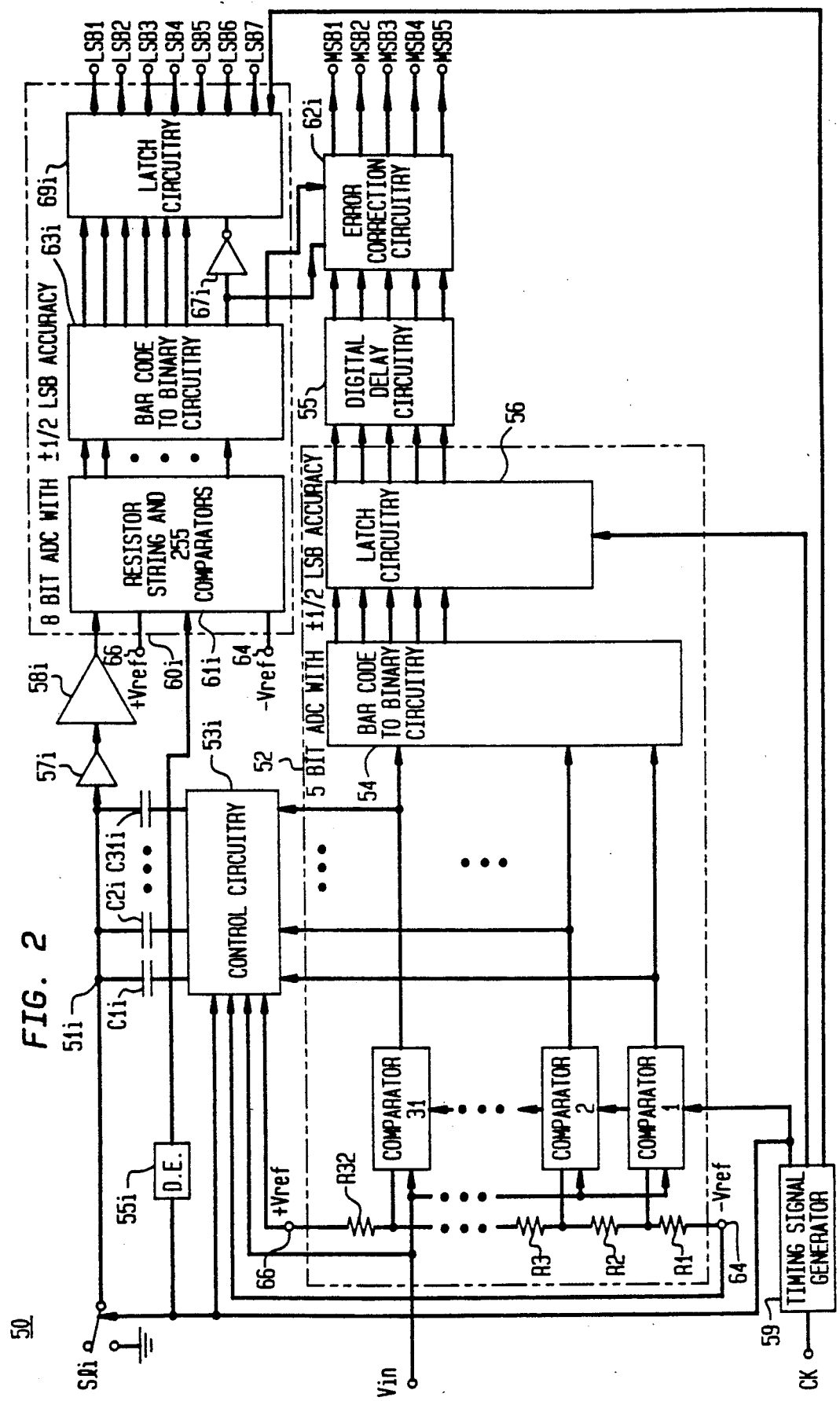
FIG. 2 shows a 12 bit Analog-to-Digital Converter (ADC) in accordance with an embodiment of the present invention.

Referring now to FIG. 2, there is shown a twelve bit Analog-to-Digital-Converter (ADC) 50 in accordance with an embodiment of the present invention. ADC 50 comprises a five bit Analog-to-Digital Convertor (ADC) 52 (shown within a first dashed line rectangle), control circuitry 53$i$, capacitors C1$i$, C2$i$, . . . C31$i$, a ground breaking switch S1$i$, a unity gain buffer 57$i$, an amplifier 58$i$, an eight bit Analog-to-Digital Convertor (ADC) 60$i$ (shown within a second dash line rectangle), digital delay circuitry 55, a timing signal generator 59 having an input terminal Ck and multiple output terminals and error correction circuitry 62$i$. Buffer 57$i$ and amplifier 58$i$ are optional depending on the input impedance of ADC 60$i$ and if it is acceptable to use different +Vref and −Vref with ADC 60$i$ than is used with ADC 52. Amplifier 58$i$ typically has a gain of sixteen when a zero based analog signal is applied to the input terminal Vin and has a gain of thirty two when a non-zero based analog signal is applied to input terminal Vin. ADC 50 performs the same basic function of ADC 10 of FIG. 1. The major difference between the two is that ADC 50 uses the capacitors C1$i$, C2$i$, . . . and C31$i$, control circuitry 53$i$ and switch S1$i$ instead of DAC 26, analog delay element 20 and operational amplifier 28 to do part of the track and hold function and to do the needed subtraction function. As will become clear, S1$i$, capacitors C1$i$, C2$i$, . . . and C31$i$ and control circuitry 53$i$, which may be denoted as capacitive subtraction means or as capacitive subtraction and sample and hold means, can be implemented using metal-oxide-semiconductor technology and these components are relatively simple to implement. Accordingly, it is possible to fabricate essentially all of the components of ADC 50 using MOS technology without the need for high performance bipolar transistor operational amplifiers or analog delay lines.

Capacitors C11$i$, C12$i$, ... C131$i$ can be MOS transistors with the gate serving as one terminal and the drain and source connected together and serving as the second terminal. In a preferred embodiment, which uses a silicon-on-sapphire structure, each capacitor essentially comprises a doped polysilicon layer separated from an n+type layer by a silicon dioxide layer. The n+type layer is formed on a top surface of a sapphire (Al$_2$O$_3$) substrate. The doped polysilicon layer serves as one terminal of the capacitor and the n+type layer serves as a second terminal of the capacitor.

ADC 52 comprises a series string of resistors R1, R2, ... and R32, comparators 1, 2, ... and 31 (only the first two and last one being shown), bar code to binary circuitry 54 and latch circuitry 56. A first terminal of resistor R1 is coupled to a voltage source −Vref, to a terminal 64 and to an input of the control circuitry 53$i$. A first terminal of resistor 32 is coupled to a voltage source +Vref, to a terminal 66 and to another input of the control circuitry 53$i$. Each of the common connections (taps) between adjacent resistors are coupled to a separate first input of one of the 31 comparators. A first output of the timing generator 59 is coupled to an input of each of the comparators 1,2, ... and 31; a second output of the timing generator 59 is coupled to an input of S11; a third output of the timing generator 59 is coupled to an input of control circuitry 53$i$; and a fourth input of timing generator 59 is coupled to an input of latch circuitry 56. Whereas only one output of the timing generator 59 is shown coupled to a component of ADC 50, this is only symbolic and there may be more than just one output so coupled. Each of the comparators 1, 2, ... and 31 has an output which is coupled to a separate input of control circuitry 53$i$ and to a separate one of 31 inputs of bar code to binary circuitry 54. Bar code to binary circuitry 54 has five outputs which are coupled to five inputs of latch circuitry 56. Five outputs of bar code to binary circuitry are coupled to five inputs of latch circuitry 56 which have five outputs coupled to five inputs of error correction circuitry 62$i$. Five outputs of error correction circuitry 62$i$ serve as the five most significant output MSB1, MSB2, MSB3, MSB4 and MSB5 of ADC 50.

ADC 60$i$ comprises a resistor string and 255 comparators (both shown as box 61$i$), bar code to binary circuitry 63$i$, inverter 67$i$ and latch circuitry 69$i$. This resistor string (not schematically shown) is like the resistor string of ADC 52 but it has 256 resistors with the first being coupled to −Vref and the last being coupled to +Vref. Each of 255 outputs of the 255 comparators (not explicitly shown) are coupled to a separate one of 255 inputs of bar code to binary circuitry 63$i$. The first six outputs of circuitry 63$i$ are coupled to six inputs of latch circuitry 69$i$. A seventh output of circuitry 63 is coupled to an input of inverter 67$i$ whose output is coupled to a seventh input of latch circuitry 69$i$. The seventh and eighth outputs of latch circuitry 63$i$ are coupled to first and second inputs of error detection circuitry 62$i$.

Figure 3:
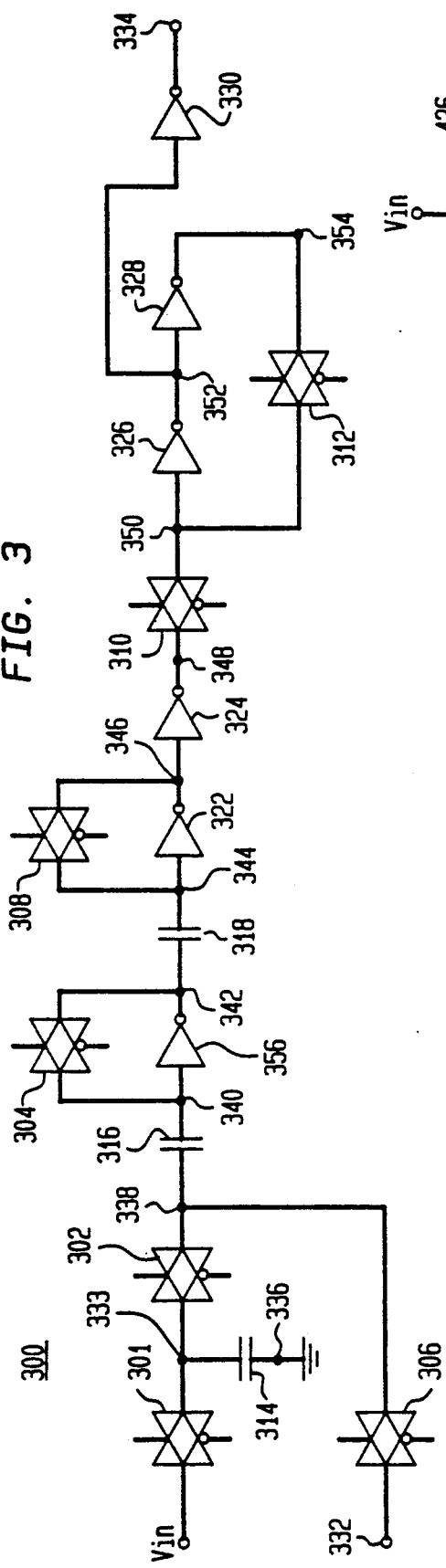
FIG. 3 shows a preferred embodiment of a comparator useful with the ADC of FIG. 2.

An ADC 50 input terminal Vin is coupled to a second input of each of the comparators 1, 2, ... and 31 of ADC 52 and to an input of the control circuitry 53$i$. Each of the comparators 1, 2, ... 31 of ADC 52 compares the magnitude of the voltage of a signal applied to the Vin terminal to the voltage of the tap between the resistors coupled thereto and generates at the output terminal thereof a voltage which is indicative of whether the applied input voltage at the Vin terminal or the resistor tap voltage is greater. Each of the 31 comparators performs a comparison function and in addition performs a track and hold function. An electrical schematic of a typical embodiment of each the comparators 1, 2, ... and 31 is shown in FIG. 3.

Figure 4:
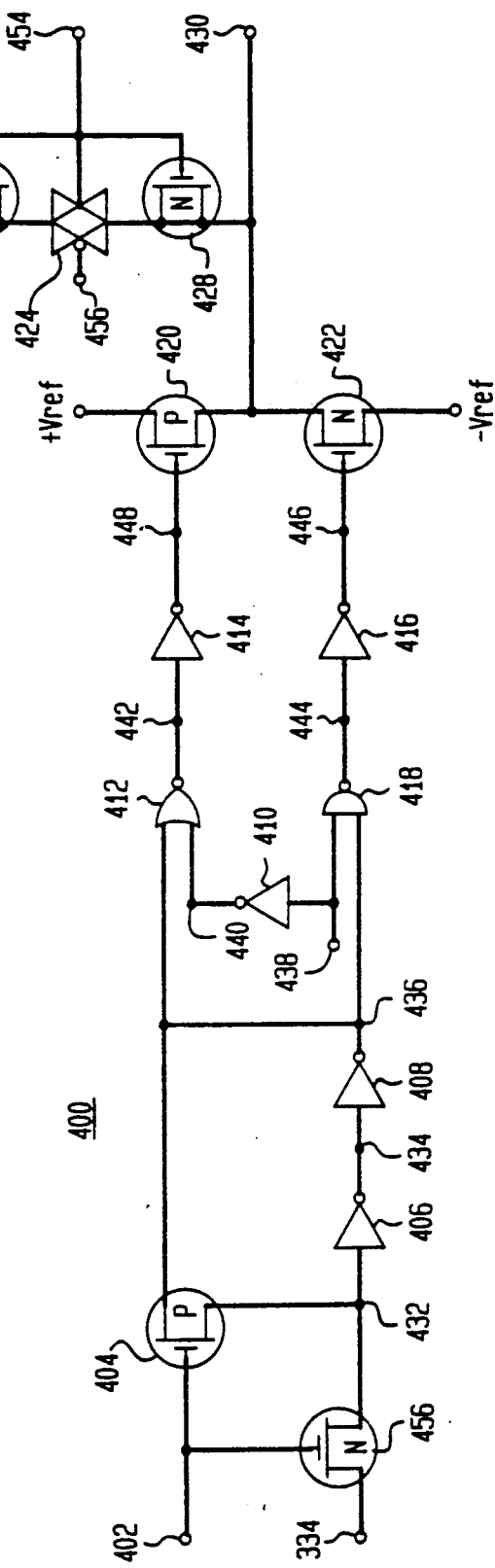
FIG. 4 shows a preferred embodiment of a control circuit of the ADC of FIG. 2.

Control circuitry 53$i$ is adapted to selectively couple first terminals of C1$i$, C2$i$, ... and C31$i$ to the Vin terminal or to the +Vref or −Vref supply voltages. The electrical schematic of a typical embodiment of the control circuitry 53$i$ is shown in FIG. 4.

Switch S1$i$ has one terminal coupled to second terminals of C1$i$, C2$i$, ... and C31$i$, to an input of buffer 57$i$ and to a terminal 51$i$. It has a second terminal which is selectively coupled to ground (0 volts). S1$i$ is closed and terminal 51$i$ is coupled to ground potential when an input signal to be sampled is applied to the input terminal Vin and same is sampled and held by the 31 comparators. Then S1$i$ is opened to hold the charge placed on the first terminals of the 31 capacitors C1$i$, C2$i$, ... and C31$i$. Output signals of the 31 comparators, which are on 31 outputs of the comparators, are coupled to a separate one of 31 inputs of the control circuitry 53$i$. The voltage level of each output of the comparators causes the control circuitry 53$i$ to set the first terminals of each of the capacitors C1$i$, C2$i$, ... and C31$i$ to +Vref or −Vref, depending on the result of each comparison made by the comparators. The combined effect of the two reference potentials applied to the first terminals of the capacitors C1$i$, C2$i$, ... C31$i$ is to vary the potential of terminal 51$i$ (the second terminal of each of the 31 capacitors. In effect the two applied voltage levels, i.e., the input voltage applied to Vin and selectively to first terminals of the capacitors C1$i$, C2$i$, ... and C31$i$, and the reference voltages (+Vref and −Vref) which are selectively applied to the first terminals of the same capacitors, are subtracted to provide a net resultant signal which is generated on terminal 51$i$. Terminal 51$i$ is coupled through the near unity gain buffer 57$i$ to amplifier 58$i$ which amplifies the resultant signal. The amplified resultant signal is then coupled to an input ADC 60$i$. It is then processed by ADC 60$i$.

Control circuitry 53$i$, capacitors C1$i$, C2$i$, ... and C31$i$ and ground break switch S11 provide a track and hold function that results in the average potential level of an input signal (not shown) applied to input terminal Vin during a selected period of time being coupled to the first terminals of the capacitors C1$i$, C2$i$, ... and C31$i$ and held as charge on these capacitors. The accuracy of this track and hold operation is typically 12 bits. Each of the comparators 1, 2, ... and 31 comprises its own track and hold circuit which typically has an accuracy of 5 bits. Accordingly, ADC 50 eliminates the need for the complex track and hold circuit 12, the capacitor C1 and the clocked buffer 14, all of ADC 10 of FIG. 1.

Latch circuitry 69$i$ of ADC 60$i$ operates essentially like latch circuitry 36 of ADC 29 of FIG. 1 and at seven outputs thereof generates digital output signs LSB1$i$, LSB2$i$, LSB3$i$, LSB4$i$, LSB6$i$ and LSB7$i$, which represent the seven least significant bits of a 12 bit generated output signal of ADC 50. Error detection circuitry 62$i$ operates essentially like error detection circuitry 24 of ADC 10 of FIG. 1 and generates at 5 outputs thereof MSB1$i$, MSB2$i$, MSB3$i$, MSB4$i$, and MSB5$i$, which represent the five most significant bits of the 12 bit output signal of ADC 50.

Referring now to FIG. 3, there is shown a track and hold/comparator circuit 300 which is a typical embodiment of the 31 comparators of ADC 52 of FIG. 2. Track and hold-comparator 300 comprises transmission gates 301, 302, 304, 306, 308, 310 and 312, capacitors 314, 316, and 318, amplifier-inverters 356 and inverters 322, 324, 326, 328 and 330. Each of the transmission gates essentially comprises a parallel combination of an n-channel and a p-channel MOS transistor with the first terminal being the drain of the n-channel transistor and the source of the p-channel transistor and the second output terminal being the source of the n-channel transistor and the drain of the p-channel transistor. The control terminals of each transmission gate are the gates of the two transistors. A control signal is typically coupled directly to the gate of the n-channel transistor and is connected through an inverter to the gate of the p-channel transistor. The circle within the line extending therefrom in the bottom middle of each transmission gate is the gate terminal of the p-channel transistor and the vertical line thereabove is the gate terminal of the n-channel transistor. The signals which control all of the transmission gates 301, 302, 304, 306, 308, 310 and 312 are supplied from the timing generator 59 of ADC 52 of FIG. 2 or are derived therefrom.

Track and hold/comparator circuit 300 serves to first sample and hold the potential level of an input signal applied to the input terminal Vin, which is coupled to a first terminal of transmission gate 301. When gate 301 is turned on, the voltage level of a signal applied to Vin is transferred through transmission gate 301 to capacitor 314. When transmission gate 301 is turned off the voltage on capacitor 314 is held on capacitor 314 as the potential thereof. The voltage received on a terminal 332 is from one of the taps on the resistor string of the ADC 52 of FIG. 2. When gate 306 is turned on the potential level on terminal 332 is transferred through transmission gate 306 to capacitor 316. When transmission gate 306 is turned off, the voltage on capacitor 316 is held on capacitor 316 as the potential thereof. When transmission gate 302 is turned on, the capacitor 314 is connected to the capacitor 316, and the voltages on the two capacitors are added together to produce a composite voltage on the capacitor 316. The composite voltage resulting on capacitor 316 from the signal applied to terminal Vin and the voltage applied to terminal 332 is then amplified and inverted five times by inverter amplifiers 356, 322, 324, 326 and 330. This voltage appears at an output terminal 334. Output terminal 334 is coupled to the control circuitry 53i of ADC 50 of FIG. 2. Output terminal 334 is also shown connected to the drain of transistor 456 of circuit 400 of FIG. 4 which is one of 31 essentially identical circuits of control circuitry 53i.

Input terminal Vin is coupled to a first terminal of transmission gate 301 whose second terminal is coupled to a first terminal of transmission gate 302, a first terminal of capacitor 314 and to a terminal 333. A first terminal of transmission gate 306 is coupled to a terminal 332. A second terminal of transmission gate 306 is coupled to a second terminal of transmission gate 302, a first terminal of capacitor 316 and to a terminal 338. A second terminal capacitor 316 is coupled to a first input terminal of amplifier-inverter 356, a first terminal of transmission gate 304 and to a terminal 340. An output terminal of amplifier-inverter 356 is coupled to a second terminal of transmission gate 304, a first terminal of capacitor 318 and to a terminal 342. A second terminal of capacitor 318 is coupled to a first input terminal of amplifier-inverter 322, a first terminal of transmission gate 308 and to a terminal 344. An output terminal of amplifier-inverter 322 is coupled to a second terminal of transmission gate 308, an input of inverter 324 and to a terminal 346. An output of inverter 324 is coupled to a first terminal of transmission gate 310 and to a terminal 348. A second terminal transmission gate 310 is coupled to an input of inverter 326, a first terminal of transmission gate 312 and to a terminal 350. An output of inverter 326 is coupled to an input of each inverters 328 and 330 and to a terminal 352. An output of inverter 328 is coupled to a second terminal of transmission gate 312 and to a terminal 354. An output of inverter 330 is coupled to the output terminal 334.

Referring now to FIG. 4, there is shown a circuit 400 which is a typical embodiment of one of 31 essentially identical circuits which comprise the control circuitry 53i of the ADC 50 of FIG. 2. Control circuitry comprises 31 of circuits 400, one corresponding to and being connected to one of 31 outputs of the 31 comparators of ADC 52 of ADC 50 of FIG. 2. Circuit 400 comprises p-channel MOS transistors 404 and 420, n-channel MOS transistors 422, 426, 428 and 456, inverters 406, 408, 410, 414 and 416, two input NOR gate 412, two input NAND gate 418 and transmission gate 424. The n-channel transistors 426 and 428, which both have their respective drain and source terminals connected together, each essentially acts as a capacitor. The basic function of circuit 400 is to control a voltage appearing at output terminal 430 such that same is either the voltage applied to input terminal Vin or +Vref or −Vref, which are the voltage sources used. An input of circuit 400 is shown coupled to terminal 334 which is the output terminal of the comparator of FIG. 3.

The gates of transistors 404 and 456 are coupled to a terminal 402. The drain of transistor 404 is coupled to the source of transistor 456, an input of inverter 406 and to a terminal 432. An output of inverter 406 is coupled to an input of inverter 408 and to a terminal 434. An output of inverter 408 is coupled to the source of transistor 404, to a first input of each of gates 412 and 418 and to a terminal 436. A second input of gate 418 is coupled to an input of the inverter 410 and to a terminal 438. An output of inverter 410 is coupled to a second input of gate 412 and to a terminal 440. An output of gate 418 is coupled to an input of inverter 416 and to a terminal 444. An output of inverter 416 is coupled to the gate of transistor 422 and to a terminal 446. An output of inverter 414 is coupled to the gate of transistor 420 and to a terminal 448. The source of transistors 420 and 422 are coupled to voltage supplies Vref and −Vref, respectively. The drains of transistors 420 and 422 are coupled to the drain and source of transistor 428, to a first terminal of transmission gate 424 and to an output of terminal 430 of control circuitry 400. A second terminal of transmission gate 424 is coupled to the drain and source of transistor 426 and to the Vin terminal. Circuit 400 operates as follows: An output signal from the comparator of FIG. 3 is applied to the terminal 334 and thus to the drain of transistor 456. A "1" control signal applied to terminal 402 turns on transistor 456 and turns off transistor 404. This permits the signal (a "1" or a "0") applied to terminal 334 to reach terminal 432. This signal is inverted twice by inverters 406 and 408 and appears at terminal 436 and at the first inputs of gates 412 and 418. As soon as the signal from terminal 334 has been established at terminal 432, the signal applied to terminal 402 is switched from a "1" to a "0". This turns off transistor 456 and turns on transistor 404. This isolates terminal 432 from terminal 334 while transistor 404 is turned (biased) on. Inverters 406 and 408 and transistor 404 form a latch circuit which holds the level of the signal previously applied to terminal 432.

A subtraction control signal, a "1" or a "0", is applied to terminal 438 which when in the "0" state effectively forces transistors 420 or 422 to be turned on as a function of the signal level applied to terminal 436. When a "0" is applied to terminal 438, the output of inverter 410 is a "1" and the output of NOR gate 412 is a "0" independent of the signal applied to terminal 436. The signal appearing at the gate (terminal 448) or p-channel transistor 420 is thus a "1" and transistor 420 is turned (biased) off. With a "0" applied to terminal 438, the output (terminal 444) of NAND gate 418 is a "1", independent of the signal applied to terminal 436. The signal appearing at terminal 446 (the gate of n-channel transistor 422) is thus a "0". This biases off transistor 422. Accordingly, the voltage appearing at output terminal 430 is not coupled to +Vref or −Vref if the signal applied to terminal 438 is a "0". In this case a "0" and a "1" are applied to terminals 456 and 454 of transmission gate 424 and an input signal (typically the voltage of an analog signal) applied to the Vin terminal passes through transistors 426, transmission gate 424 and transistor 428 and appears on output terminal 430. Thus with terminal 438 having a "0" applied thereto, the signal appearing at output terminal 430 is the same as applied to input terminal Vin.

If a "1" is applied to terminal 438, and terminals 54 and 456 have a "0" and a "1", respectively, applied thereto the following occurs. Transmission gate 424 is turned off and the Vin terminal is electrically isolated from output terminal 430. The levels of the outputs (terminals 442 and 444) of gates 412 and 418, respectively, now can be modified by a level of a signal on terminal 436. If a "1" now exists on terminal 436, the output (terminal 442) of NOR gate 412 is a "0" and the output of inverter 414 (terminal 448) is "0". This keeps transistor 420 biased off. The "1" applied to terminal 436 causes the output (terminal 444) of NAND gate 418 to be a "0". This causes the output (terminal L 446) of inverter 416 to be a "1" which turns (biases) on n-channel transistor 422. This causes output terminal 430 to be set to the potential level of −Vref. If a "0" instead of a "1" is applied to terminal 436, then the output (terminal 442) of NOR gate 412 is a "1" and the output (terminal 448) of inverter 414 is a "0". This turns (biases) on transistor 420 and causes output terminal 430 to assume the potential level of +Vref as long as transistor 422 is biased off at this time. The "0" applied to terminal 436 at this time causes the output of NAND gate 418 to be a "0" and the output of inverter 416 to be a "1". This biases (turns) off transistor 422 and thus isolates output terminal 430 from −Vref. Accordingly, the potential of output terminal 430 is that of +Vref at this time.

It is clear that circuity 400 selectively allows output terminal 430 to be at +Vref, −Vref or at the potential level of an input signal applied to Vin. The output terminal 430 of each of the 31 circuits 400 which comprise control circuitry 53i of FIG. 2 is coupled to a separate first terminal of the 31 capacitors C1i, C2i, . . . and C31i. Control signals needed to control the voltages of terminals 402, 438, 454 and 456 are received from the output(s) of the timing signal generator 59 of ADC 50 of FIG. 2 or are derived therefrom.

Figure 5:
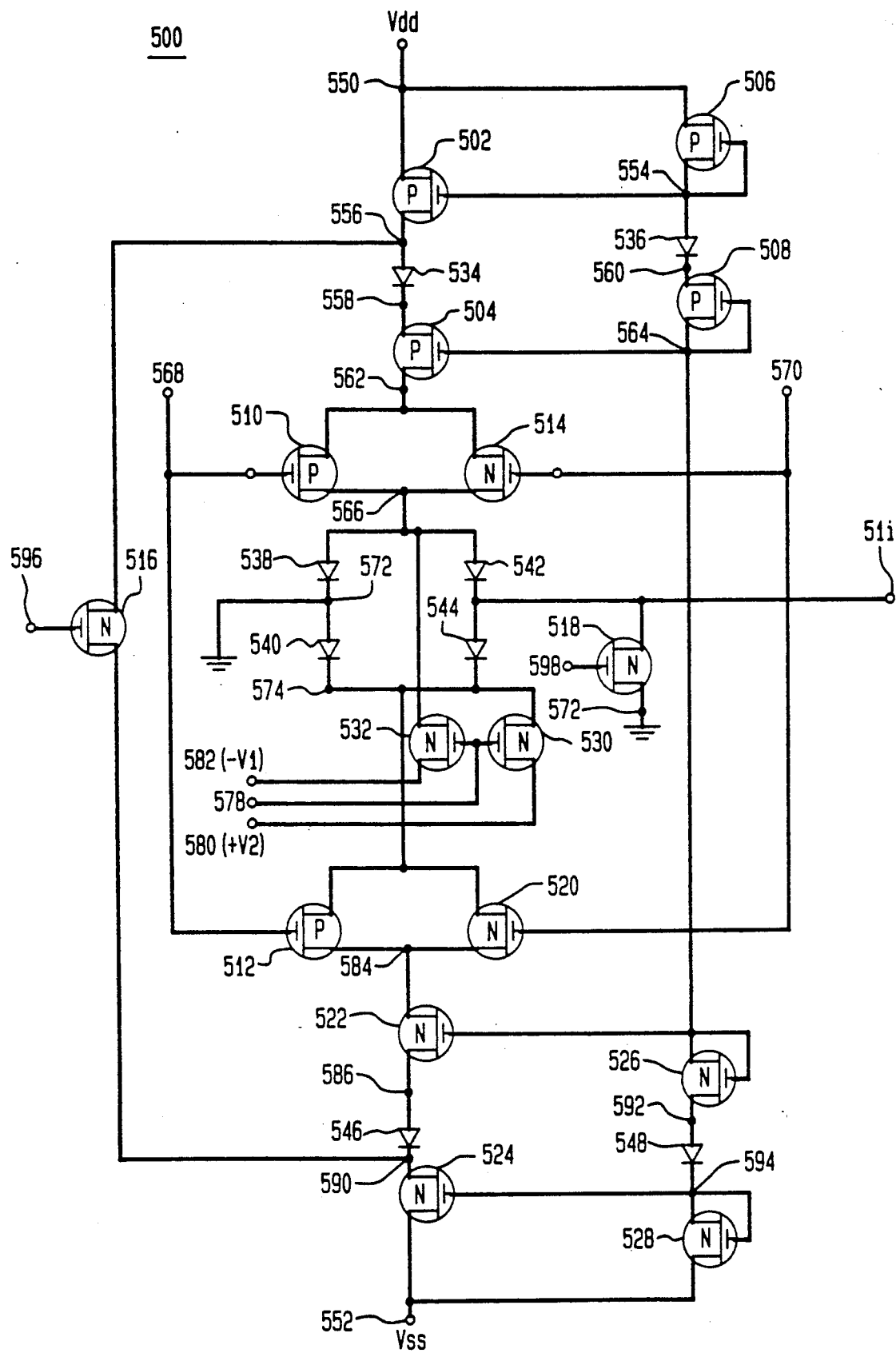
FIG. 5 shows a preferred embodiment of a switching circuit of the ADC of FIG. 2.

Referring now to FIG. 5, there is shown switching circuitry 500 which is a preferred embodiment of S1i of FIG. 2. Switching circuitry 500 is designed to selectively set an output terminal 51i thereof to ground potential and then to allow it to electrically float in potential. Switching circuitry 500 comprises p-channel MOS transistors 502, 504, 506, 508, 510 and 512, n-channel MOS transistors 514, 516, 518, 520, 522, 524, 526, 528, 530 and 532, diodes 534, 536, 538, 540, 542, 544, 546, and 548 and a capacitor C1. In a preferred embodiment all of the diodes are Schottky barrier diodes. Switching circuitry 500 is the subject of another patent application, Ser. No. 359176, which is being filed concurrently with the present patent application and in which there is a common assignee and one common inventor.

The sources of transistors 502 and 506 are coupled to a terminal 550 and to a positive voltage source Vdd. The sources of transistors 524 and 528 are coupled together to a terminal 552 and to a negative voltage source Vss. An input terminal 572, which is coupled to a ground potential, is also coupled to the cathode of diode 538 and to the anode of diode 540. The source of transistor 532 is coupled to a terminal 582 which is coupled to a negative voltage source −V1. The source of transistor 530 is coupled to a terminal 580 which is coupled to a positive voltage source +V2. The cathode of diode 542 is coupled to the anode of diode 544, to the drain of transistor 518 and to the circuitry output terminal 51i. Output terminal 51i is coupled to the second terminals of capacitors C1i, C2i, . . . and C31i of ADC 50 of FIG. 2. A second terminal of capacitor C1 is coupled to a terminal 600 to which signals or voltage levels can be applied.

The drain of transistor 502 is coupled to the anode of diode 534, to the drain of transistor 516 and to a terminal 556. The gate and the drain of transistor 506 are coupled to the gate of transistor 502, to the anode of diode 536 and to a terminal 554. The cathode of diode 534 is coupled to the source of transistor 504 and to a terminal 558. The cathode of diode 536 is coupled to the source of transistor 508 and to a terminal 560. The gate and drain of transistor 508 are coupled to the gate of transistor 504, to the gate and drain of transistor 526, to the gate of transistor 522 and to a terminal 564. The source of transistor 504 is coupled to the source of transistor 510, to the drain of transistor 514 and to a terminal 562. The drains of transistors 510 and 532 are coupled to the source of transistor 514, to the anode of diodes 538 and 542 and to a terminal 566. The gates of transistors 510 and 512 are coupled to a terminal 568. The gates of transistors 514 and 520 are coupled to a terminal 570. The source of transistor 516 is coupled to the cathode of diode 546, to the drain of transistor 524 and to a terminal 590. The gate of transistor 516 is coupled to a terminal 596. The cathodes of diodes 540 and 544 are coupled to the drains of transistors 520 and 530, to the source of transistor 512 and to a terminal 574. The gate of transistor 518 is coupled to a terminal 598. The source of transistor 518 is coupled to a terminal 572 and to a reference potential which is shown as ground. The gates of transistors 530 and 532 are coupled to a terminal 578. The drains of transistors 512 and 522 are coupled to the source of transistor 520 and a terminal 584. The source of transistor 522 is coupled to the anode of diode 546 and to a terminal 586. The source of transistor 526 is coupled to the anode of diode 548 and to a terminal 592. The cathode of diode 548 is coupled to the gate and drain of transistor 528, to the gate of transistor 524 and to a terminal 594.

The serial combination of transistors 506, 508, 526 and 528 and diodes 536 and 548 serves to generate voltages at the gates of transistors 502 and 524 that insure that an essentially constant current flows through transistors 502 and 524. This current can be selectively switched through a first circuit leg comprising diode 534, transistors 504, 510, 512, 514, 520 and 522 and diodes 534, 538, 540, 542, 544 and 546 or can flow through a second circuit leg which comprises transistor 516.

Assuming first that transistor 516 is biased on by an appropriate potential applied to the gate (terminal 596) thereof and transistors 510, 512, 514 and 520 are biased off by appropriate voltage levels applied to the gates (terminal 568 for transistors 568 and 570, terminal 70 for transistors 514 and 520) thereof. Transistors 530 and 532 are both biased (turned) on (enabled) and thus potentials -VI and +V2, which are coupled to terminals 582 and 580, respectively, past through turned-on transistors 532 and 530, respectively, and appear on terminals 566 and 574, respectively. This reverse biases diodes 538, 540, 542 and 544. Transistor 518 is biased off at this time by an appropriate potential applied to the gate (terminal 598) thereof. Thus output terminal 51i is isolated from all other components of switching circuitry 500 and electrically floats in potential. A voltage level or signal (both not shown) applied to terminal 600 while terminal 51i is floating in potential affects the potential level of terminal 51i.

When it is desired to actively hold output terminal 51i at ground potential, transistors 516, 530 and 532 are biased off and transistors 510, 512, 514, 518 and 529 are biased on. This causes current flow through the second circuit leg (transistor 516) to be cut off and switches the current flow to the first circuit leg where it divides equally between the series combination of diodes 538 and 540 and the series combination of diodes 542 and 544. The turning on of transistor 518 causes terminal 51i to rapidly be set to ground potential. After a short time period (e.g., typically about 10 nanoseconds) transistor 518 is turned off and the potential of output terminal 51i is typically close to ground potential but not close enough in some applications due to transient effects. To insure that terminal 51i is set to ground potential, current flow through the first circuit leg is maintained until terminal 51i is at ground potential and then it is cut off by turning off transistors 510, 512, 514 and 520 and turning on transistors 530 and 532.

Diodes 538 and 540 form one leg of a Wheatstone bridge and diodes 542 and 544 form the other leg of the Wheatstone bridge. With diode 538 being matched to diode 542 and diode 540 being matched to diode 544, and with equal current flow through both series combinations of diodes, the potential level, in this case ground potential, applied to terminal 572, appears at output terminal 51i. Accordingly, with current flow through diodes 538, 540, 542 and 544, the potential of output terminal 51i is set to and held at ground. Current flow through diodes 538, 540, 542 and 544 is continued after transistor 518 is biased off such that a true ground signal exists on output terminal 51i before current flowing through the diodes 538, 540, 542 and 544 is cut off and diodes 538, 540, 542 and 544 are reversed biased. This essentially and rapidly electrically isolates the capacitors C1i, C2i... and C31i of ADC 50 of FIG. 2 from the circuitry 500. The signals coupled to terminals 568, 578 and 596 to control the operation of circuitry 500 are received from an output of timing signal generator 59 of FIG. 2 or derived therefrom. Diodes 534 and 546 help limit leakage from the first circuit leg to terminals 556 and 590, respectively.

Figure 6:
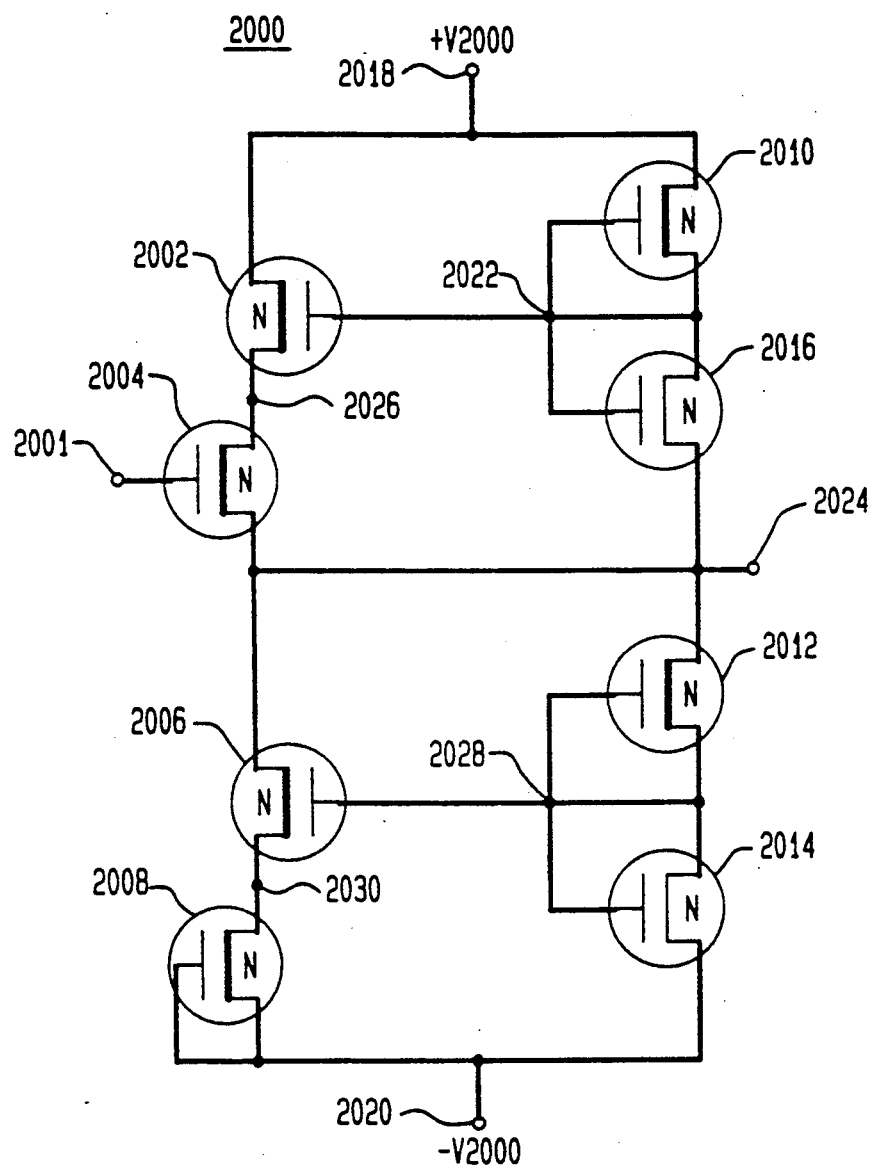
FIG. 6 shows a preferred embodiment of the unity gain buffer of FIGS. 2 and 7.
Figure 7:
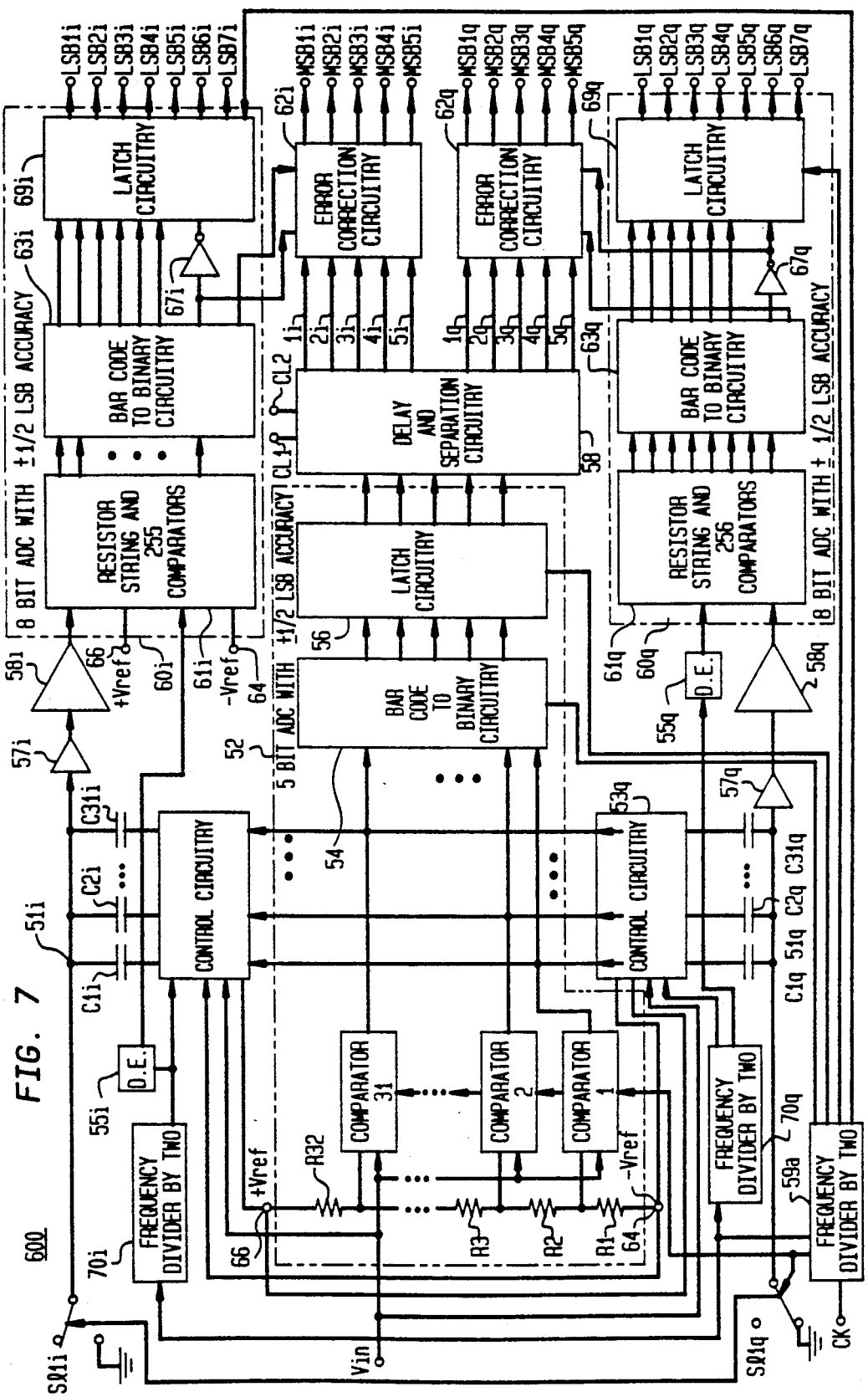
FIG. 7 shows a 12 bit Analog-to-Digital Converter ADC in accordance with another embodiment of the present invention.

Referring now to the FIG. 6, there is shown a buffer circuit 2000 which is the preferred embodiment of the unity gain buffer 57i of FIG. 2 and of the unit gain buffers 57i and 57q of FIG. 7. Buffer circuit 2000 comprises n-channel depletion mode field effect transistors (FET's) 2002, 2004, 2006, 2008, 2010, and 2012 and n-channel enhancement mode field effect transistors (FET's) 2014 and 2016. Each of the transistors has a gate, a source, and a drain. The source and drain may be denoted as first and second output terminals or as second and first output terminals. A buffer circuit 2000 input terminal 2001 is coupled to the gate of transistor 2004 and a buffer circuit output terminal 2024 is coupled to the sources of transistors 2004 and 2016 and to the drains of transistors 2006 and 2012. Buffer circuit 2000 is characterized in that it has a relatively high input impedance, a relatively low output impedance, and has essentially zero-offset voltage (i.e, the voltage level of an output signal (not shown) generated by buffer circuit 2000 at output terminal 2024 has essentially the same voltage level as an input signal (not shown) applied to input terminal 2001). Buffer circuit 2000 is the subject of another patent application, Ser. No. 356,311, titled Unity Gain CMOS/SOS Zero Offset Buffer, which is being filed concurrently with the present patent application and in which there is a common assignee and one common inventor.

In a typical embodiment transistors 2004 and 2008 are essentially identical, transistors 2002 and 2006 are essentially identical, transistors 2010 and 2012 are essentially identical and transistors 2014 and 2016 are essentially identical. All of the transistors are typically metal-oxide-silicon (MOS) transistors which can be fabricated in the silicon of a silicon-on-sapphire (SOS) substrate or in bulk silicon.

The drains of transistors 2002 and 2010 are coupled together to a terminal 2018 and to a positive voltage supply +V2000. The gate and source of transistor 2008 are coupled to the source of transistor 2014, to a terminal 2020 and to a negative voltage source −V2000.

The gate of transistor 2002 is coupled to the gates of transistors 2010 and 2016, to the source of transistor 2010, to the drain of transistor 2016, and to a terminal 2022. The source of transistor 2002 is coupled to the drain of transistor 2004 and to a terminal 2026. The gates of transistors 2006, 2012 and 2014 are coupled to the source of transistor 2012, to the drain of transistor 2014, and to a terminal 2028. The source of transistor 2006 is coupled to the drain of transistor 2008 and to a terminal 2030.

As will be come clear from the following description, transistor 2004 acts essentially as a near ideal source follower with essentially no offset voltage. Thus with a given voltage level applied to input terminal 2001 (the gate of transistor 2004), the same voltage level appears at output terminal 2024. Transistor 2004 is an MOS transistor and thus its input impedance is high and its output impedance is relatively low. The delay time associated with transistor 2004 is relatively small since it is a depletion mode MOS transistor which is a normally on device. Accordingly, the response time of transistor 2004 is relatively fast.

Transistors 2016 and 2002 form a first feed back circuit (also denoted as a first feed back circuit means or as a first voltage clamp circuit) from output terminal 2024 (the source of transistor 2004) to terminal 2026 (the source of transistor 2002 and the drain of transistor 2004). Transistor 2016 is connected essentially as a diode. The voltage level appearing at output terminal 2024 is shifted up by the drain-source (gate) voltage of enhancement mode transistor 2016 and appears at terminal 2022 (the gate and drain of transistor 2016 and the gates of transistors 2010 and 2002). Depletion mode transistor 2002 acts as first source follower and accordingly the voltage appearing at the gate thereof (terminal 2022) also appears at the source thereof (terminal 2026) with little offset. Transistor 2002 does not provide as ideal source follower action as transistor 2004 since the gate-to-drain voltage of transistor 2002 does vary somewhat as a signal (not shown) applied to input terminal 2001 varies. The combination of transistors 2016 and 2002 function to cause the voltage of terminal 2026 (the drain of transistor 2004) to be held at an essentially fixed voltage (essentially the drain-source (gate) voltage of transistor 2016) above the drain (terminal 2024) of transistor 2004 even with changes in the voltage of terminal 2024. The voltage at terminal 2022 is a function of the size of transistor 2016 relative to the sizes of transistors 2010, 2012 and 2014 and the current flowing therethrough which is a function of the sizes of transistors 2010, 2012, 2014 and 2016 and the magnitudes of voltage sources +V2000 and -V2000.

Since, as will be discussed latter herein, transistor 2004 acts as a near ideal source follower during operation of circuit 2000 the voltage of output terminal 2024 (the drain of transistor 2004) is essentially identical to a voltage (not shown) applied to input terminal 2001 (the gate of transistor 2004). Accordingly, the voltage of terminal 2026 (the drain of transistor 2004) is held at a positive essentially fixed voltage above the gate (input terminal 2001) of transistor 2004. This positive essentially fixed voltage is selected to facilitate the operation of transistor 2004 in a high gain portion of its operating range.

Transistor 2008 has the gate and source thereof coupled together to -V2000. As such it acts as an essentially constant current source which gives rise to a first current which flows from +V2000 serially through transistors 2002, 2004, 2006 and then through transistor 2008 and then to -V2000. Transistors 2010 and 2012 are also configured with their gates and sources coupled together and also serve as current sources which give rise to a second current which flows from +V2000 serially through transistors 2010, 2016, 2012, 2014 and then to -V2000.

Transistors 2014 and 2006 form a second feed back circuit (also denoted as a second feed back circuit means or as a second voltage clamp circuit) from terminal 2020 (the gate and source of transistor 2008) to terminal 2030 (the drain of transistor 2008). Transistor 2014 is connected essentially as a diode. The voltage level of terminal 2028 is shifted up by the drain-source (gate) voltage of enhancement mode transistor 2014 and appears at terminal 2028 (the gate of transistor 2006). Depletion mode transistor 2006 acts as a second source follower and accordingly the voltage appearing at the gate thereof (terminal 2028) also appears at the source thereof (terminal 2030), which coupled to the drain of transistor 2008, with little offset. Transistor 2006 does not provides as ideal source follower action as transistor 2004 since the gate-to-drain voltage of transistor 2006 does vary as the output signal on the output terminal 2024 varies. The combination of transistors 2014 and 2006 function to cause the voltage of terminal 2030 (the drain of transistor 2008) to be held at an essentially constant fixed voltage above the gate and source (terminal 2020) of transistor 2008. The voltage at terminal 2028 is a function of the size of transistor 2014 relative to the sizes of transistors 2010, 2012 and 2016 and the magnitudes of the voltage sources +V2000 and -V2000.

The two feed back circuits and the selection of transistors 2002 and 2006 to be essentially identical, the selection of transistors 2014 and 2016 to be essentially identical and the selection of transistors 2012 and 2016 to be essentially identical, results in the drain-to-source voltages of transistors 2004 and 2008 being essentially identical. Because the current flowing through transistors 2004 and 2008 is also identical, the gate-to-source voltage of transistor 2004 is forced to be the same as the gate-to-source voltage of transistor 2008 which is zero volts. Accordingly, transistor 2004 acts as a near ideal source follower and thus signals (not shown) applied to input terminal 2001 appear essentially without offset at circuity 2000 output terminal 2024. Since the potential of the source (terminal 2024) of transistor 2004 is essentially the same as that potential applied to the gate (input terminal 2001) thereof, the drain-to-gate potential of transistor 2004 is essentially held constant even with variations in the signal levels applied to input terminal 2001. This is one feature which is needed for transistor 2004 to function as an ideal source follower. Thus buffer circuit 2000 acts as a high input impedance, low output impedance, high speed, near unity gain MOS buffer which can be fabricated in the silicon of a silicon-on-sapphire substrate or in bulk silicon.

In a typical embodiment +V2000 and -V2000 have voltage magnitudes of about +3 and -3 volts, respectively, all of the transistors are MOS transistors with each having a channel length of about 2 microns. transistors 2002, 2004, 2006 and 2008 each have a channel width in the range of about 200 to 400 microns, transistors 2014 and 2016 each have a channel width in the range of about 10 to 20 microns and transistors 2010 and 2012 each have a channel width in the range of about 20 to 40 microns.

Referring now to FIG. 7, there is shown a twelve bit Analog-to-Digital Converter (ADC) 600 in accordance with another embodiment of the invention. ADC 600 uses most of the components of ADC 50 of FIG. 2 with each having the same reference number and in addition uses a second complete set of thirty-one capacitors C1$q$, C2$q$, ... and C31$q$ (which are essentially identical to the capacitors C1$i$, C2$i$, ... and C31$i$), a unity gain buffer 57$q$ (which is essentially identical to unity gain buffer 53$i$), an amplifier 68$q$ (which is essentially identical to amplifier 68$i$), an eight bit ADC 60$q$ (which is essentially identical to ADC 60$i$) with plus or minus ½ LSB accuracy, latch circuitry 56$q$ (which is essentially identical to latch circuitry 56$i$), error correction circuitry 62$q$ (which is essentially identical to error correction circuitry 62$i$), a switch S12 (which is essentially identical to S11), a timing signal 59$a$ (which is similar to timing generator 59 of ADC 50 of FIG. 2) and first and second frequency divider circuits 70$i$ and 70$q$.

A clock signal (not shown) coupled to input terminal Ck if timing signal generator controls many of the operations of ADC 600. A first output of timing signal generator 59a is coupled to inputs of each of the comparators 1, 2, ... and 31 and to ground break switches S1i and S1q. The signal generated at the first output of timing signal generator 59a is typically essentially the same as the signal applied to Ck but some what delayed. A second output of generator 59a is coupled to an input of each of the frequency dividers by two 70i and 70q. Outputs of the frequency dividers by two 70i and 70q are coupled to inputs of control circuitries 53i and 53q, respectively, and through delay elements (D.E.) 55i and 55q to the comparators of 69i and 69q, respectively, of ADC 60i and ADc60q, respectively. Second third, fourth and fifth outputs of generator 59a are coupled to latch circuitry 56, delay and separation circuitry 58, latch circuitry 69i and latch circuitry 69q, respectively. Accordingly, the 31 comparators run at the frequency of a clock signal applied to the clock input terminal Ck and the control circuitries 53i and 53q, and the 8 Bit ADC's 60i and 60q both run at one half of said frequency.

ADC 600 is able to run at about twice the frequency of ADC 10 of FIG. 2. An upper section of ADC 600 comprises frequency divider 70i, control circuitry 53i, capacitors C1i, C2i, ... and C31i, buffer 57i, amplifier 58i, 8 Bit ADC 60i, latch circuitry 56i and error correction circuitry 62i. The upper section processes each odd sample of an input signal applied to Vin and provides a 12 bit output digital signal having most significant bits MSB1i, MSB2i, MSB3i, MSB4i and MSB5i and having least significant bits LSB1i, LSB2i, LSB3i, LSB4i, LSB5i, LSB6i and LSB7i. A lower section of ADC 600, which comprises frequency divider circuit 70q, switch S1iq, control circuitry 53q, capacitors C1q, C2q ... and C31q, buffer 57q, amplifier 58q, eight bit ADC 60q, latch circuitry 56q and error correction circuitry 62q processes each even sample of an input signal applied to Vin and provides a 12 bit output signal having most significant bits MSB1q through MSB5q and least significant bit LSB1q through LSB7q.

The sampling af an input signal applied to Vin alternatively by the upper and then the lower sections of ADC 600 allows a doubling of the over all speed of operation and it is believed that ADC 600 could possibly
run from at least several MHz to about 40 MHz. In order to achieve this high speed operation with relatively high accuracy, it is necessary that the components of the upper and lower sections of ADC 600 be closely matched. The control circuitries 53i and 53q as well as the ground break switches S11i and S12q are easily closely matched since all are formed of MOS transistors. The capacitors C1i, C2i ... and C31i and C1q, C2q, ... and C31q are typically form using MOS technology and therefore can also be closely matched as is needed. One disadvantage of ADC 10 of FIG. 1 is that it is difficult to closely match the components that perform the subtraction function and therefore it is difficult to have essentially identical upper and lower sections which would facilitate a higher frequency of operation.

Figure 8:
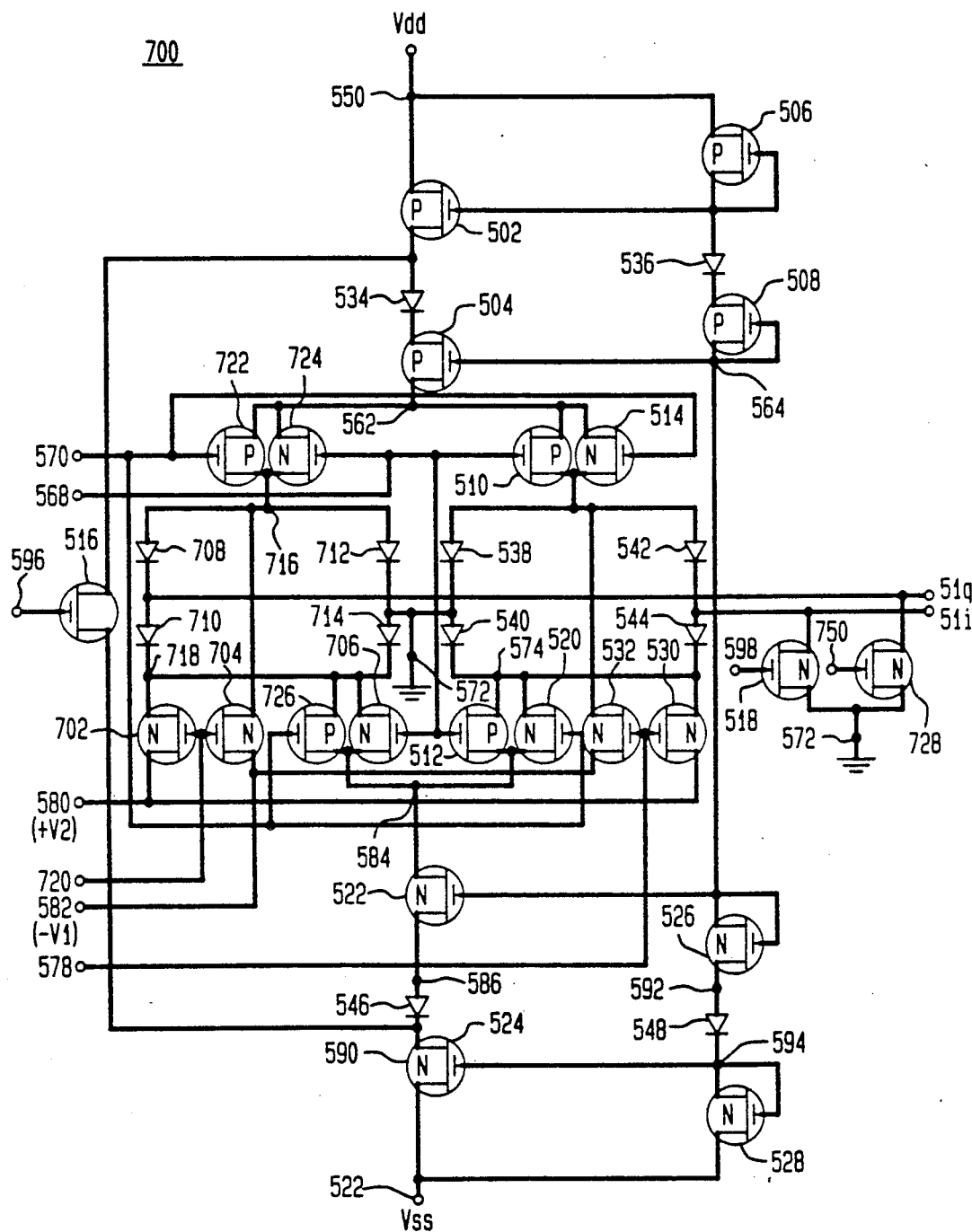
FIG. 8 shows a preferred embodiment of a switching circuit of the ADC of FIG. 7.

Referring now to FIG. 8, there is shown the switching circuitry 700 which is preferred embodiment of S11 and S12 of FIG. 7. Switching circuitry 700 has the same basic configuration as switching circuitry 500 of FIG. 5 and has the same components with the same reference numbers and configuration and in addition comprises n-channel transistors 702, 704, 706 and 724, p-channel transistors 722 and 726 and diodes 708, 710, 712 and 714.

In a preferred embodiment diodes 708, 710, 712 and 714 are Schottky barrier diodes. Output terminals 51i and 51q of circuitry 700 are coupled to second terminals of capacitors C1i, C2i, ... and C31i and to capacitors C1q, C2q, ... and C31q, respectively. Switching circuitry 700 is the subject of another patent application, Ser. No. 359,176, titled Precise High Speed CMOS Track (Sample)/Hold Circuits, which is being filed concurrently with the present patent application and in which there is a common assignee and one common inventor.

Circuitry 700 performs the same basic function as circuitry 500 of FIG. 5 in that it selectively causes output terminal 51i to be set to ground potential and held there and then it subsequently electrically isolates output terminal 51i and allows it to float in potential. In addition, circuitry 700 selectively causes the output terminal 51q to be set to ground potential and held there and then it subsequently electrically isolates output terminal 51q and allows it to float in potential (voltage). During the time periods that output terminals 51i and 51q electrically float in potential, potentials applied to capacitors C1i, C2i, ... and C31i and C1q, C2q, ... and C31q and causes the potentials (voltages) of terminals 51i and 51q, respectively, to be modified as a function of the applied voltages and then to float in potential at the newly established levels.

The drains of transistors 504, 514 and 724 are coupled to the source of transistors 510 and 722 and to the terminal 562. The gates of transistors 514, 520, 722 and 726 are coupled to the terminal 570. The gates of transistors 510, 512, 706 and 724 are coupled together to a terminal 568. The drain of transistor 722 is coupled to the source of transistor 724, to the anodes of diodes 708 and 712, to the drain of transistor 704 and to a terminal 716. The cathode of diode 708 is coupled to the anode of diode 710, to the drain of transistor 728, to a first terminal of capacitor C2 and to a third circuitry output terminal 51q. The gate of transistor 728 is coupled to a terminal 750. The sources of transistors 518 and 728, the cathodes of diodes 538 and 712 and the anode of diodes 540 and 714 are coupled to a terminal 572 which is coupled to ground. The cathodes of diodes 710 and 714 are coupled to the drains of transistors 702 and 706, to the source of transistor 726 and to a terminal 718. The drains of transistors 503 and 702 are coupled together to the terminal 580 and to a positive voltage source +V2. The sources of transistors 532 and 704 are coupled together to the terminal 582 and to a negative voltage source —V1. The gates of transistors 702 and 704 are coupled together to a terminal 720. The sources of transistors 520 and 706 are coupled to the drain of transistors 512, 522 and 726 and to a terminal 584.

Transistor 516 forms a first circuit leg; transistors 510 and 514, diodes 538, 540 542 and 544 and transistors 512 and 520 form a second leg circuit; and transistors 722 and 724, diodes 708, 710, 712 and 714 and transistors 706 and 726 form a third circuit leg. Diodes 534 and 546 and transistors 504 and 522 are common components of the second and third circuit legs.

Output terminals 51i and 51q both float in potential when transistor 516 is turned-on and transistors 510, 512, 514 and 520 are biased on or off and transistors 722, 724 and 726 are biased oppositely. In addition, transistors 530 and 532 are turned-on to reverse bias diodes 538, 540, 542 and 544 and transistors 702 and 704 are turned-on to reverse bias diodes 708, 710, 712 and 714. These conditions result in current flow through the first circuit leg (transistor 516) and capacitors C1i, C2i, ...

and C31i and C1q, C2q, . . . and C31q being electrically isolated from each other and from components of circuitry 700 and electrically floating in potentials which can be modified by potentials applied to the first terminals of capacitors C1i, C2i, . . . and C31i and C1q, C2q, . . . C31q.

If it is now desired to set the potential of output terminal 51i to ground potential, transistors 516, 530 and 532 are turned-off and the transistors 706, 722, 724 and 726 are turned-off, transistors 702 and 704 are left turned-on and transistor 728 is turned on. This initially causes transistor 518 to rapidly turn on and pull output terminal 51i to ground potential and hold it there. It also results in current flow through the second circuit leg which sets the potential of output terminal 51i to ground potential and holds it there. Transistor 518 is turned off as soon as the second leg holds the output terminal 51i at ground potential. Transistor 518 serves essentially as a rapid pull up device to cause output terminal 51i to rapidly reach ground potential. Output terminal 51q floats in potential at this time and is modified in potential by any signal or voltage level applied to terminal 752. Transistor 518 is turned-on when current begins to flow through the second circuit leg in order to help quickly set the output terminal 51i to ground potential. It is turned-off before current is cut-off through the second circuit leg because it's turn-off results in transients which vary the potential of output terminal 51i from ground potential. These transients are dissipated by subsequent current flow through the second circuit leg. Thus output terminal 51i reaches ground potential and then floats there after current is cutoff through the second circuit leg by the turning on of transistor 516.

If subsequently it is desired to set the potential of output terminal 51q to ground potential, transistors 706, 722, 724 and 726 are turned-on and transistors 510, 512, 514, 516 and 520 are turned-off. This results in current flow through the third circuit leg which sets the potential of output terminal 51q to ground and holds it there. Output terminal 51i floats in potential at this time and is modified in potential by a signal or voltage level applied to terminal 600. Transistor 728 is turned-on when current begins to flow through the third circuit leg and rapidly sets the output terminal 51q to ground potential. It is turned-off before current is cut-off through the third circuit leg because it's turn-off results in transients which vary the potential of output terminal 51q from ground potential. These transients are dissipated by subsequent current flow through the third circuit leg. Thus output terminal 51q reaches ground potential and then floats in potential after current is cutoff through the third circuit leg.

Referring now to FIGS. 9, 10, 11, 12, 13, 14 and 15 there are graphically shown voltage waveforms applied to terminals 596, 568, 570, 720, 578, 598 and 750, respectively, of apparatus 700 of FIG. 8. FIGS. 16 and 17 graphically show the resulting voltage waveforms appearing on terminals 51i and 51q, respectively, of apparatus 700 of FIG. 8 when the voltage waveforms of FIGS. 9, 10, 11, 12, 13, 14 and 15 are used. In FIGS. 9, 10, 11, 12, 13, 14, 15, 16 and 17 the y-axis of each is voltage V (volts) and the x-axis is time T (nanoseconds).

With the voltage waveforms of FIGS. 9, 10, 11, 12, 13, 14 and 15 applied to terminals 596, 568, 570, 720, 578, 598 and 750, respectively, the output terminal 51i is set to and actively held at ground potential during the time periods T=t0 to t2, T=t8 to t10 and T=t16 to t18 and electrically floats in potential during the time periods T=t2+ to t8− and T=t10+ to t16−. With the same applied waveforms, output terminal 51q is set to and actively held at ground potential during the time periods T=t4 to t6 and T=t12 to t14 and electrically floats in potential during the time periods T=t0 to t4−, T=t6+ to t12− and T=t14+ to t18−. The frequency of the waveform of FIG. 9 is essentially twice that of the frequency of each of the waveforms of FIGS. 10, 11, 12 and 13. The transitions of the waveforms of FIGS. 10 and 11 are shown to be sloped (not vertical). This decreases injected charge due to parasitic capacitance (not shown) between the gates of transistors 510, 512, 514, 520, 702, 704, 722 and 724 and their respective drains and sources.

Referring now to FIG. 18, there is shown a circuit 1800 which is a preferred embodiment of the delay and separation circuitry 58 of FIG. 7. Circuitry 58 comprises five essentially identical sections DSC1, DSC2, DSC3, DSC4 and DSC5, a delay element 876, inverters 878, 880 and 882 and a transmission gate 884. Only the components of DSC1 are shown.

DSC1 comprises a delay element 800 (shown in the dash line rectangle), transmission gates 802, 804, 806, 808, 810, 812, 814 and 816 and inverters 818, 820, 822, 824, 826, 828, 830 and 832. Delay element 800 comprises a plurality of an even number of inverters of which the first two 834 and 836 and the last two 838 and 840 are shown. Delay element 800 and the delays introduced by a first electrical path through the series of combinations of transmission gate 802, inverter 818, transmission gate 804, inverter 820, transmission gate 806, inverter 822 and transmission gate 808 and by a second electrical path through the series combination of transmission gate 810, inverter 826, transmission gate 812, inverter 828, transmission gate 814, inverter 830, transmission gate 816 and inverter 832 are designed such that output signals on output lines 1i and 1q reach error detection circuitries 62i and 62q, respectively, at the same time as corresponding output signals from bar code to binary circuitries 63i and 63q, respectively. DSC1 functions such that the portions of an input signal applied to input terminal Vin of ADC52 which are processed by capacitors C1i, C2i, . . . and C31i and ADC 61i are provided on output lines 1i, 2i, 3i, 4i and 5i of circuitry 58 and portions of an input signal applied to input terminal Vin of ADC52 which are processed by capacitors C1q, C2q . . . C31q and ADC 60q are provided on output lines 1q, 2q, 3q, 4q and 5q of circuitry 1800.

An input of DSC1 is coupled to a first output of latch circuitry 56 of FIG. 7 and to an input of inverter 832. An output of inverter 832 is coupled to an input of inverter 834. An output of inverter 834 is coupled to an input of the next inverter (not shown) whose output is coupled to the next inverter (not shown). An output of the last not shown inverter is coupled to an input of inverter 836 whose output is coupled to an input of inverter 838. An output of inverter 838 is coupled to first inputs of transmission gate 802 and 810 and to a terminal 840. An output of transmission gate 802 is coupled to an input of inverter 818 and to a terminal 842. An output of inverter 818 is coupled to an input of transmission gate 804 and to a terminal 844. An output of transmission gate 804 is coupled to an input of inverter 820 and to a terminal 846. An output of inverter 820 is coupled to and input of transmission gate 806 and to a terminal 848. An output of transmission gate 806 is coupled to an input of inverter 822 and to a terminal 850. An output of inverter 822 is coupled to an input of transmission gate 808 and to a terminal 852. An output of transmission gate 808 is coupled to an input of inverter 824 and to a terminal 854. An output of inverter 824 is coupled to output terminal 1*i* of circuitry 58.

An output terminal of transmission gate 810 is coupled to an input of inverter 826 and to a terminal 856. An output of inverter 826 is coupled to an input of transmission gate 812 and to a terminal 860. An output of transmission gate 812 is coupled to an input of inverter 828 and to a terminal 864. An output of transmission gate 814 is coupled to an input of inverter 830 and to a terminal 866. An output of inverter 830 is coupled to an input of transmission gate 816 and to a terminal 868. An output of transmission gate 816 is coupled to an input of inverter 832 and to a terminal 870. An output of inverter 832 is coupled to output terminal 1*q* of circuitry 58.

First control terminals of transmission gates 802, 806, 812 and 816 and second control terminals of transmission gates 804, 808, 810 and 814 are coupled to a first source C11 of a control signal and to a terminal 872. Second control terminals of transmission gates 802, 806, 812 and 816 and first control terminals 8704, 808, 810, and 814 are coupled to a second source C12 of control signal, which is the opposite of C11, and to a terminal 874.

Delay element 876 (shown within a dash line rectangle) comprises a plurality of an even number of inverters of which the first two 886 and 888 and the last two 890 and 892 are shown. An output of inverter 892 is coupled to an input of inverter 878, to an input of transmission gate 884 and to a terminal 894. An output of inverter 878 is coupled to an input of inverter 882 and to a terminal 898. Outputs of inverters 880 and 882 are coupled to terminals 872 (C11) and 874 (C12), respectively. Transmission gate 884, which has a first control terminal coupled to voltage source Vdd and has a second control terminal coupled to voltage source Vss, is biased on such that a signal path exists between terminals 894 and 898. It is designed to introduce essentially the same delay to a signal passing from terminal 894 to terminal 898 as inverter 878 introduces to a signal passing from terminal 894 to terminal 896. Inverters 882 and 896 are essentially identical such that signals passing through both experience the same time delay. A control signal from timing signal generator 59 of ADC 50 of FIG. 2 is coupled to the input of inverter 886. After a delay which is introduced by delay element 876, the signal reaches the inputs of inverter 878 and transmission gate 884.

The delayed signal is then further delayed by inverters 878 and 880 and appears at terminal 872 (C11). The same delayed signal is also delayed by the same time by transmission gate 884 and inverter 882 and is inverted by inverter 882 and appears at terminal 874 (C12). The signals appearing at terminals 872 (C11) and 874 (C12) are the inverse of each other but they are not delayed from each other as would be the case if the signal appearing at terminal 872 were inverted by a single inverter 9not shown) whose input is coupled to terminal 872 and whose output is coupled to terminal 874.

DSC1 operates as follows: a signal from latch circuitry 56 of FIG. 6 appears at the input of inverter 832 of DSC1. The signal is delayed by the inverters of delay element 800 and then appears at terminal 840. Assuming that transmission gates 802 and 806 are switched on by C11 and that accordingly transmission gates 810 and 814 are switched off by C12. This allows the signal (to be denoted the first sample signal) to pass through transmission gate 802 and then to be inverted by inverter 818. Thus the original signal, now inverted, appears at terminal 844 and the input of transmission gate 804, which is switched off by C12 at this time. Since transmission gate 810 is switched off at this time it does not transmit the input signal to terminal 856. Now assume that C11 and C12 reverse states. This switches off transmission gates 802 and 806 and switches on transmission gate 810 and 814. The previous signal at the input (terminal 844) of transmission gate 804 passes through transmission gate 804, is inverted by inverter 820 and appears at the terminal 848 of switched off transmission gate 806. The input signal now at terminal 840, which may have charge at this time, and will be denoted as the second sample signal, can not pass through transmission gate 802 but does pass through transmission gate 810 and is inverted by inverter 826 and appears at the input (terminal 860) of transmission gate 812 which is switched off. Now C11 and C12 reverse again. This allows the first sample signal to pass through switched on transmission gate 806 and to then be inverted by inverter 822 and to appear at the input of transmission gate 808 (which is switched off at this time). it also allows the second signal sample to pass through switched on transmission gate 812 and to then be inverted by inverted 828 and to appear at the input (terminal 864) of transmission gate 814. Now C11 and C12 reverse again. This allows the first signal sample to pass through switched in transmission gate 808 and to be inverted by inverter 824 and to thus appear on output line 1*i*. Since the first sample signal is inverted four times by inverters 818, 820, 822 and 824, it is the same signal that was originally applied to the input of inverter 832 and to the input of transmission gate 802 except for being delayed in time. At this time the second sample signal passes through switched on transmission gate 814 and is inverted by inverter 830 and appears at the input 9terminal 868) of switched off transmission gate 870. A third portion of the signal (to be denoted as the "third sample signal") passes through switched on transmission gate 802 and is inverted by inverter 818 and appears at the input (terminal 844) of switched off transmission gate 804. The third sample signal is prevented from passing through the transmission gate 810 which is switched off at this time. The second signal sample passes through switched on transmission gate 816, is inverted by inverter 832, and appears on output terminal 1*q* of DSC1. The second signal sample is the same as appeared at the input of inverter 832 and the input (terminal 840) of transmission gate 810 since it was inverted four times by inverter 826, 828, 8309 and 832. Accordingly, a first signal sample of a signal applied to the input of inverters 802 and 832 of DSC1 appears on DSC1 output line 1*i* and a second signal sample of the same signal appears on DSC1 output line 1*q*.

The third signal sample will subsequently appear on output line 1*q*. Accordingly, odd numbered samples of a signal from latch circuitry 56 applied to the input of inverter 832 of DSC1 appear on output line 1*i* and even numbered samples of the same signal appear on output line 1*q*. Signals from latch circuitry 56 which are applied to inputs of DSC2, DSC3 and DSC4 and DSC5 like wise are separated such that each odd numbered sample appears on the i output line and each even numbered sample appears on the q output line.

Figure 19:
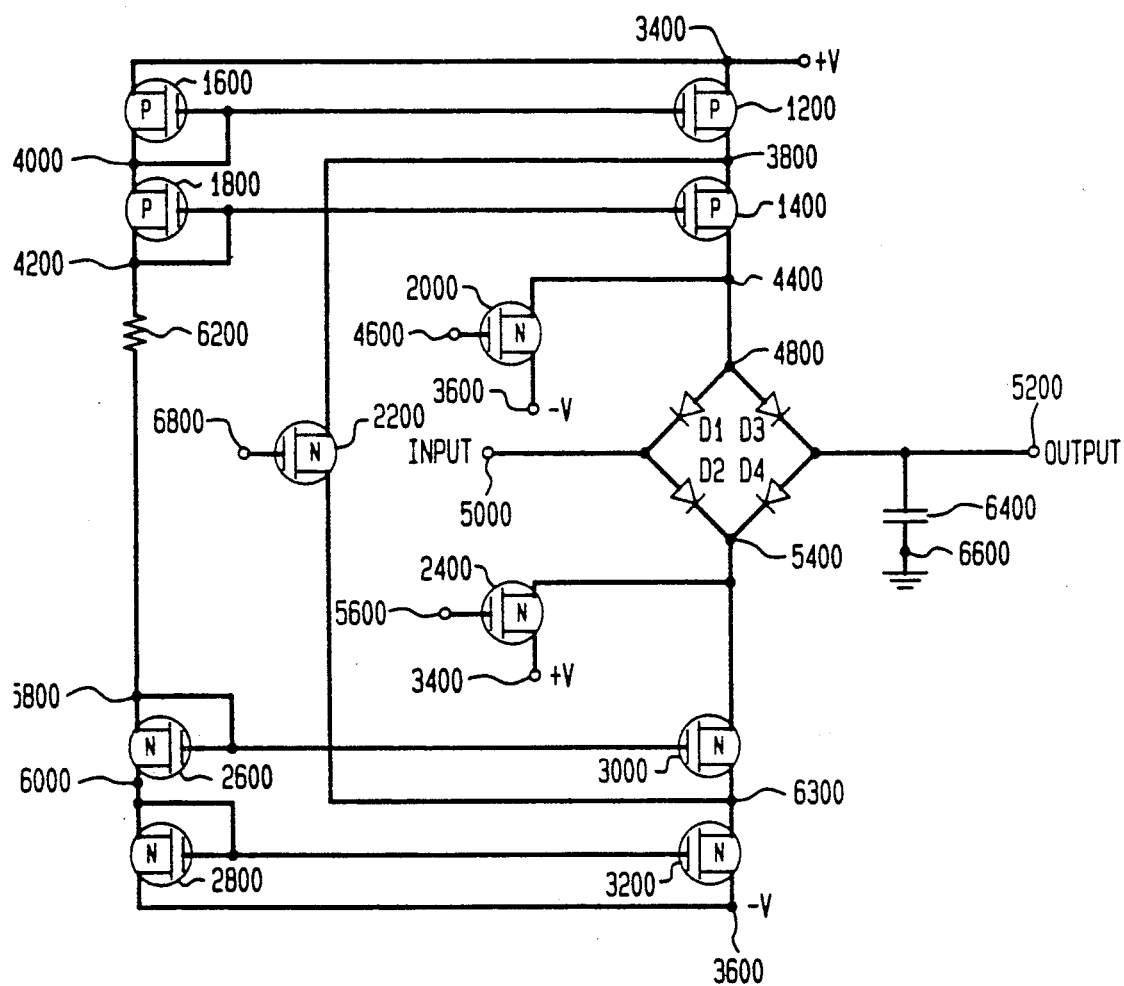
FIG. 19 shows a track (sample)/hold circuit useful with the ADC's of FIGS. 2 and 7.

Referring now to FIG. 19, there is shown a track (sample)/hold circuit 1000 which can be substituted for portions of the ADC's of FIGS. 2 and 7. Circuit 1000 comprises p-channel transistors 1200, 1400, 1600 and 1800, n-channel transistors 2000, 2200, 2400, 2600, 2800, 3000, and 3200, diodes D1, D2, D3, and D4, a resistor 6200 and a capacitor 6400. An input terminal 5000 is coupled to the anode of D1 and to the cathode of D2. An output terminal 5200 is coupled to the cathode of D3, to the anode of D4 and to a first terminal of capacitor 6400. Circuit 1000 acts to accurately and rapidly sample the voltage level of an input signal applied to input terminal 5000 and to generate on output terminal 5200 an output signal which has the same magnitude and polarity as the applied input signal and which is held as the voltage of capacitor 6400.

Transistors 1400 and 3000, diodes D1, D2, D3 and D4 and capacitor 6400 form a first circuit leg of circuit 1000. Transistor 6800 forms a second circuit leg of circuit 1000. Transistors 1200 and 3200 form an essentially constant current source which generates an essentially constant current which is switched between the legs of the circuit 1000. Transistors 1600, 1800, 2600 and 2800 and resistor 6200 form a biasing circuit which biases on (enables) transistors 1400 and 3000 of the first circuit leg and transistors 1200 and 3200 of the essentially constant current source by generating appropriate voltage levels at terminals 4000, 4200, 5600 and 6000. Transistors 2000 and 2400 serve as reverse biasing circuitry (means) which selectively causes D1, D2, D3, and D4 to be reverse biased so as to facilitate a cut off of current flow through the second circuit leg and to electrically isolate output terminal 5200 from the rest of circuit 1000 except for capacitor 6400.

A first positive voltage source $+V$ is coupled to the sources of transistors 1200 and 1600, to the drain of transistor 2400 and to a terminal 3400. A second negative voltage source $-V$ is coupled to the sources of transistors 2000, 2800 and 3200 to a terminal 3600. A second terminal of capacitor 6400 is coupled to a terminal 6600 and to reference potential (shown as ground potential). The reference potential is typically selected to be essentially midway in voltage between voltage sources $+V$ and $-V$.

It is assumed in an n-channel transistor that positive current flow occurs form on output terminal denoted as the drain to other output terminal denoted as the source. It is assumed in a p-channel transistor that positive current flow occurs form one output terminal denoted the source to another output terminal denoted the drain. If the direction of current flow through a transistor reverses, the designation of the output terminals as a drain or source reverses.

The gate of transistor 1200 is coupled to the gate and drain of transistor 1600, to the source of transistor 1800 and to a terminal 4000. The drains of transistors 1200 and 2200 are coupled to the source of transistor 1400 and to a terminal 3800. The gate of transistor 1400 is coupled to the gate and drain of transistor 1800, to a first terminal of resistor 6200 and to a terminal 4200. The drains of transistors 1400 and 2000 are coupled to the anodes of diodes D1 and D3 and to a terminal 4800. The gate of transistor 2000 is coupled to a terminal 46. The cathodes of diodes D2 and D4 are coupled to the drain of transistor 3000, to the source of transistor 2400 and to a terminal 54. The gate of transistor 3000 is coupled to the gate and drain of transistor 2600 and to a terminal 5800. The sources of transistors 2200 and 3000 are coupled to the drain of transistor 3200 and to a terminal 6300. The gate and drain of transistor 2800 and the gate of transistor 2200 are coupled to a terminal 6000.

Diodes D1, D2, D3 and D4, which in a preferred embodiment are Schottky barrier diodes, are configured as a Wheatstone bridge. D1, D2, D3, and D4 are essentially identical in electrical characteristics.

The operation of circuit 1000 is as follows: Assume that control signals applied to the gates (terminals 4600, 6800, and 5600) of transistors 2000, 2200 and 2400 are at low levels, "O's". This biases off (disables) transistors 2000, 2200 and 2400. This condition results in a flow of current from $+V$ through the first leg of circuit 1000 and to $-V$. Current flow through transistor 1200 and 1400 splits and flows through D1 and D2 and through D3 and D4 and then recombines to flow through transistors 3000 and 3200.

An input signal having a potential level in a useful range between $+V$ and $-V$ less operating voltage drops across transistors 1200, 1400, 3000 and 3200 is applied to input terminal 5000. The Wheatstone bridge comprising diodes D1, D2, D3 and D4 acts to automatically adjust current flow through D1 and D3 and through D2 and D4 such that the potential of output terminal 5200 closely follows the potential applied to input terminal 5000. This is easily seen in that the potential of terminal 4800 is one diode (D1) drop above that of input terminal 5000. Since output terminal 5000 is also one diode (D3) drop below terminal 4800 and the voltage drop across D1 equals the voltage drop across D3 when equal currents flow through both, the voltage of output terminal 5200 is equal that of input terminal 5000. Soon after output terminal 5200 is set to the same voltage as input terminal 5000, transistors 2000, 2200 and 2400 are enabled (biased on) by applying high levels of "1's" to gate terminals 4600, 5000, and 5600. This enables (biases on) transistors 2000, 2200, and 2400 which in turn reverse biases D1, D2, D3 and D4 and facilitate current flow through transistor 2200. Accordingly, current flow ceases through the first leg of circuit 1000 and begins through the second leg of circuit 1000 which comprises transistor 2200. The potential of terminals 3800 and 6300, across which the switching transistor is held, is essentially equal to the fixed bias potentials of terminals 4000 and 6000, respectively, regardless of the potentials that terminals 4800 and 5400 assume as they track the input voltage. Thus the switching performance of transistor 2200 is essentially independent of the input voltage applied to input terminal 5000. Since current through D1, D2, D3, and D4 is cutoff and they are all reversed biased, output terminal 5200 is left floating in potential at the previous value of an input signal applied to input terminal 5000. The potential level of the voltage on output terminal 5200 is held by capacitor 6400. Now the input signal level applied to input terminal 5000 can change and then transistors 2000, 2200 and 2400 can again be disabled. The output signal at output terminal 5200 then assumes the same potential level and polarity as the second input signal applied to input terminal 5000.

Circuit 1000 is particularly useful as a track (hold)-/sample circuit of an Analog-to-Digital Converter (ADC) wherein the input signal to input terminal 5000 is an analog signal. Circuit 1000 is used to rapidly take continuous samples of the analog input signal and to accurately reproduce same at output terminal 5200. Schottky barrier diodes have essentially no minority carrier storage and operate in a forward bias condition with just a few (e.g., typically 200 to 400) hundred millivolts. This makes it possible to rapidly turn on and off diodes D1, D2, D3 and D4 and thus facilitates a high rate of sampling of an input analog signal applied to input terminal 5000.

Figure 20:
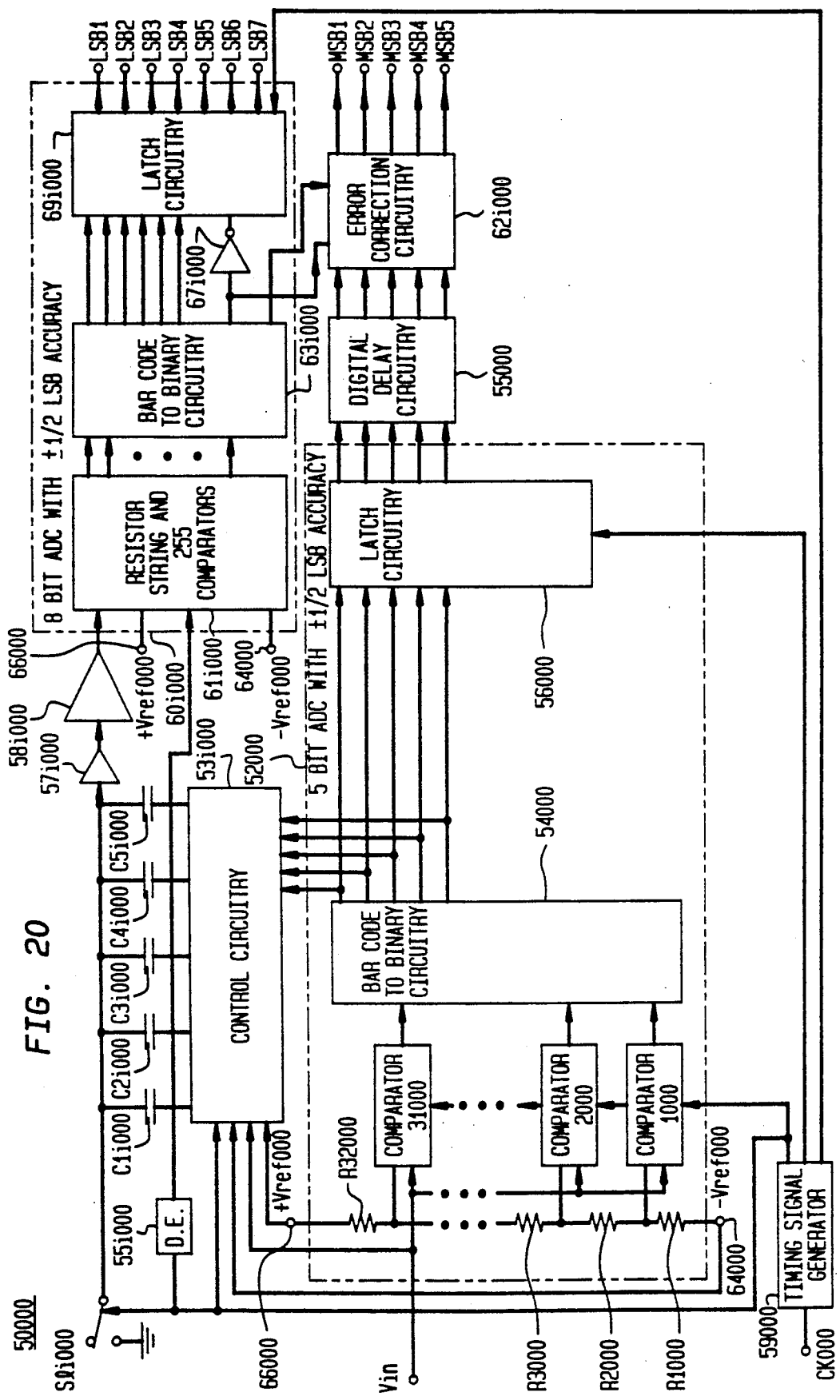
FIG. 20 shows a 12 bit Analog-to-Digital Converter (ADC) in accordance with another embodiment of the present invention.

Referring now to FIG. 20, there is shown a twelve bit analog-to-digital converter (ADC) 50000 in accordance with another embodiment of the invention. ADC 50000 is very similar to ADC 50 Of FIG. 2 in structure and basic operation. All similar or essentially identical components and terminals have the same reference designation with "000" added thereafter. In ADC 50000 five output terminals of bar code to binary circuitry 54000 are coupled to five separate inputs of control circuitry 53i000 whereas in ADC 50 of FIG. 2, the 31 outputs of the comparators 1, 2, ... 31 are coupled to 31 inputs of control circuitry 53i. In addition, ADC 50000 has five binary weighted capacitors C1i000, C2i000, C3i000, C4i000 and C5i000 having unit capacitive values of 1, 2, 4, 8 and 16, respectively, having first terminals coupled to five outputs of control circuitry 53i000 and having second terminals coupled to a first terminal of switch S11000 and to an input of unity gain buffer circuit 57i000. This is to be compared with ADC 50 which has 31 capacitors similarly coupled between 31 outputs of control circuitry 53i and the switch S11 and the unity gain buffer 57i.

One advantage of ADC 50000 compared to ADC50 is that there are only five connections between ADC 52000 (the outputs of the bar code to binary circuitry 54000) and control circuitry 53i000 compared to 31 similar connections in ADC 50 and there are only five capacitors compared to the 31 capacitors of ADC 50. Another advantage of ADC 50000 compared to ADD 50 is that the control circuitry 53i000 need contain only five of the circuits 400 of FIG. 4 compared to the 31 circuits 400 needed to implement control circuitry 53i. Accordingly, ADC 50000 has fewer components and interconnections that ADC 50 of FIG. 2. It is believed that ADC 50000 may have to be operated at a somewhat lower frequency that ADC 50 because signals which control control circuitry 53i000 must be processed by bar code to binary circuitry 54000 and do not come directly from the 31 comparators of ADC 52000.

ADC 50000 can be modified to increase the frequency of operation by about twice by adding another section thereto which includes a duplication of S11000, D.E.000, control circuitry 53i000, capacitors C1i000-C5i000 and ADC60i000 plus frequency divider by two circuits in essentially the same manner that ADC 50 of FIG. 2 was modified to become ADC 600 of FIG. 7.

It is to be appreciated that the specific embodiments described are merely illustrative of the general principles of the invention. Various modifications may be provided consistent with the principles set forth. For example, an additional upper section and an additional lower section can be added to ADC 600 of FIG. 7 provided the frequency dividers of all four sections are dividers by four. This combination results in an increase in the maximum frequency that can be used. Still further, in addition to adding a lower section to ADC 5000 of FIG. 20, one more upper and another lower section can be added to further increase the frequency of operation. Still further, multiple additional upper and lower sections can added to ADC's 600 and 5000 to further increase the frequency of operations thereof. Still further, instead of each of the comparators of ADC 50 of FIG. 2, ADC 600 of FIG. 7 and ADC 50000 of FIG. 20 having its own track and hold circuit, a single track and hold circuit could be used for all of the comparators of each ADC.

What is claimed is:

1. 1. In combination:

an n bit analog-to-digital converter (ADC) means adapted to receive an input analog signal and being responsive thereto for generating a digital output representation corresponding to said analog signal; and capacitive means, which is coupled to the n bit ADC means, which is adapted to receive the analog signal and which comprises a plurality of capacitors, for selectively storing a voltage level, referred to as V1, of the analog signal and for subsequently subtracting therefrom via charge redistribution in the capacitors, a voltage level, referred to as V2 and corresponding to said digital output representation generated by the n bit ADC means, so as to generate a difference voltage referred to as V3, where $V3 = V1 - V2$.

2. In combination:

n bit analog-to-digital converter means having an input coupled to an input terminal of the combination for generating a first estimate of a voltage level of an analog signal applied to the input terminal of the combination and for generating a first output which is a first digital representation of the voltage level of the analog signal applied to the input terminal of the combination; and first capacitive means, including a first plurality of capacitors, having a first input selectively coupled to the input terminal of the combination and having a plurality of additional inputs coupled to the n bit analog-to-digital converter means for selectively storing the voltage level of an analog signal applied to the input terminal of the combination in the capacitors and for subsequently, in response to signals generated by the n bit analog-to-digital converter means, causing a redistribution of the charge stored on the capacitors such that an analog signal is generated at an output of the capacitive means which is the difference between the originally stored voltage level and a voltage level determined by the n bit ADC means.

3. The combination of claim 2 further comprising:

first and second frequency dividers each having first and second terminals;

an input clock terminal of the combination being coupled to a clock input of the n bit ADC and to the first terminal of each frequency divider;

second capacitive means, including a second plurality of capacitors, having a first input selectively coupled to the second terminal of the second frequency divider and having a plurality of additional inputs coupled to the n bit analog-to-digital converter means for selectively storing the voltage level of an input signal applied to the input terminal of the combination in the second plurality of capacitors thereof and for subsequently, in response to signals generated by the n bit analog-to-digital means, causing a redistribution of the charge stored in said second plurality of capacitors such that an analog signal is generated at an output of the second capacitive means which is the difference between the originally stored voltage level and a digital representation of signals generated by the n bit analog-to-digital converter means; and the first and second capacitive subtraction means being adapted such that each processes a separate portion(s) of an input signal applied to the input terminal of the combination.

4. The combination of claim 3 further comprising:
first and second substantially identical m bit analog-to-digital converter means each having an input and at least one output;
the input of the first m bit analog-to-digital convertor means being coupled to an output of the first capacitive subtraction means; and
the input of the second m bit analog-to-digital convertor being coupled to an output of the second capacitive means.

5. An x bit analog-to-digital converter (ADC) having an input terminal adapted to receive an analog signal which is to be converted and having a first set of x output terminals, said x bit ADC comprising:
a first n bit analog-to-digital converter (ADC), where n is less than x, having an input coupled to said input terminal and having n outputs which are each coupled to a separate one of n of the x output terminals of the first set of x output terminals;
a first capacitive means coupled to said input terminal and to the n bit ADC for selectively storing the voltage level of an analog signal applied to said input terminal and for subsequently subtracting from said voltage level one voltage a voltage level of a group of voltages corresponding to output signals generated by the n bit ADC in response to the analog signal;
a second m bit analog-to-digital converter (ADC), where m is less than x, having an input coupled to the capacitive means and having m outputs which are each coupled to a separate one of m of the x output terminals of the first set of x output terminals; and
n of the x output terminals of the first set of x output terminals for providing n most significant bits of a digital output signal generated by the x bit ADC from the analog signal applied to the input terminal and m of the x output terminals of the first set of x output terminals for providing m least significant bits of the digital output signal generated by the x bit ADC from said analog signal.

6. The x bit analog-to-digital convertor of claim 5 further comprising:
first and second frequency dividers each having first and second terminals;
an input x bit ADC clock terminal being coupled to the n bit ADC and to the first terminal of each of the first and second frequency dividers;
a second capacitive means coupled to the second terminal of the second frequency divider and to the n bit ADC for selectively storing the voltage of the analog signal applied to the input terminal and for subsequently subtracting from said voltage one voltage of a group of voltages which is determined by signals generated by the n bit ADC;
a third m bit analog-to-digital convertor (ADC), where m is less than x, having an input coupled to the second capacitive means and having m outputs which are each coupled to a separate one of the x output terminals of the second set of x output terminals;
the first capacitive means being coupled to the second terminal of the first frequency divider and being coupled through the first frequency divider to said input terminal; and
the first and second capacitive subtraction means being adapted such that each processes a separate portion(s) of said analog signal applied to said input terminal.

7. The x bit analog-to-digital convertor of claim 6 further comprising:
separation means, which has inputs coupled to the n outputs of the n bit ADC and has first and second sets of n outputs, for separating output signals received from the n bit ADC into two separate sets with each output of the first set of n outputs thereof being coupled to a separate one of n of the x output terminals of the first set of x output terminals of the x bit ADC and with the second set of n outputs thereof being coupled to a separate one of n of the x output terminals of the second set of x output terminals of the x bit ADC;
the x bit analog-to-digital converter being adapted such that n of the output terminals of each of the first and second sets of x output terminals each provides at least one most significant bit of a digital output signal generated by the x bit analog-to-digital converter and being further adapted such that m of the x output terminals of each of the first and second sets of x output terminals each provide at least one least significant bit of the digital output signal of the x bit ADC where $n+m=x$.

8. An x bit analog-to-digital converter (ADC) comprising:
a sample and hold circuit having an input coupled to an input terminal of the x bit ADC and having an output;
an n bit analog-to-digital converter (ADC), where n is less than x, comprising a plurality of comparators each having a first input which is coupled to the output of the sample and hold circuit and further comprising bar code to binary circuitry having a separate input coupled to a separate output of each comparator and having n outputs which are coupled to n output terminals of the x bit ADC;
capacitive subtraction means coupled to the input terminal of the x bit ADC and to the n bit ADC for selectively storing the voltage of an analog signal applied to the input terminal of the x bit ADC and for subsequently subtracting from said voltage one voltage of a group of voltages corresponding to output signals generated by the n bit ADC;
an m bit analog-to-digital converter (ADC), where m is less than x, having an input coupled to the capacitive subtraction means and having m outputs which are coupled to m output terminals of the x bit ADC; and
the n output terminals of the x bit ADC being adapted to provide n most significant bits of a digital output signal generated by the x bit analog-to-digital converter from an analog signal applied to the input terminal of the x bit ADC and the m output terminals of the x bit ADC being adapted to provide m least significant bits of the digital output signal of the x bit ADC where $n+m=x$.

9. The x bit analog-to-digital convertor of claim 8 wherein the capacitive subtraction means comprises:
a plurality of capacitors each having first and second terminals;
switching means, which has a first terminal coupled to the second terminals of the capacitors and has a second terminal which is selectively connectable to a first reference voltage source, for selectively coupling the second terminals of the capacitors to the second terminal of the switching means;

control circuitry having a plurality of inputs with a first of same being coupled to the input terminal of the x bit ADC and the other inputs being each coupled to a separate output of the n bit ADC; and the control circuitry being adapted such that selectively the first input thereof is coupled to the first terminals of the capacitors when the first and second terminals of the switching means are coupled together, and the outputs of the n bit ADC are coupled to and selectively control the control circuitry such that preselected voltages are applied to the first terminals of the capacitors when the first and second terminals of the switching means are not coupled together.

10. The x bit ADC of claim 9 wherein the capacitors have essentially equal capacitance and are equal in number to the number of comparators of the n bit ADC and an output of each comparator of the n bit ADC is coupled to a separate input of the control circuitry.

11. The x bit ADC of claim 9 wherein the capacitors are binary weighted and equal in number to the outputs of the bar code to binary circuitry and each output of the bar code to binary circuitry is coupled to a separate input of the control circuitry.

12. An x bit analog-to-digital converter (ADC) comprising:
a sample and hold circuit having an input coupled to an input terminal of the x bit ADC and having an output;
an n bit analog-to-digital converter (ADC), where n is less than x, comprising a plurality of comparators each having a first input which is coupled to the output of the sample and hold circuit and further comprising bar code to binary circuitry having a separate input coupled to a separate output of each comparator and having n outputs which are coupled to n output terminals of the x bit ADC;
a plurality of capacitors each having first and second terminals;
switching means, which has a first terminal coupled to the second terminals of the capacitors and has a second terminal which is selectively connectable to a first reference voltage source, for selectively coupling the second terminals of the capacitors to the second terminal of the switching means;
control circuitry having a plurality of inputs with a first of same being coupled to the x bit ADC input terminal and the other inputs each being coupled to a separate output of the n bit ADC;
the control circuitry being adapted such that selectively the first input thereof is coupled to the first terminals of the capacitors when the first and second terminals of the switching means are coupled together, and the outputs of the n bit ADC are coupled to and selectively control the control circuitry such that preselected voltages are applied to the first terminals of the capacitors when the first and second terminals of the switching means are not coupled together;
an m bit analog-to-digital converter (ADC), where m is less than x, having an input terminal coupled to the second terminals of the capacitors and having m outputs which are coupled to m output terminals of the x bit ADC; and the n output terminals of the x bit ADC being adapted to provide n most significant bits of a digital output signal generated by the x bit analog-to-digital converter from an analog signal applied to the input terminal of the x bit ADC and the m output terminals of the x bit ADC being adapted to provide m least significant bits of the digital output signal of the x bit ADC where $n+m=x$.

13. The x bit ADC of claim 12 wherein the capacitors have essentially equal capacitance and are equal in number to the number of comparators of the n bit ADC and an output of each comparator of the n bit ADC is coupled to a separate input of the control circuitry.

14. The x bit ADC of claim 12 wherein the capacitors are binary weighted and equal in number to the outputs of the bar code to digital circuitry and each output of the bar code to digital circuitry is coupled to a separate input of the control circuitry.

15. An x bit analog-to-digital converter (ADC) comprising:
a first n bit analog-to-digital converter (ADC) comprising a plurality of comparators and bar code to binary circuitry;
a first plurality of essentially identical capacitors equal in number to the number of comparators;
first control circuitry having inputs coupled to outputs of the comparators and being selectively responsive thereto, and having outputs coupled to first terminals of the capacitors;
an input terminal of the x bit ADC being coupled to the first n bit ADC and to the first control circuitry;
a second m bit analog-to-digital converter (ADC);
second terminals of the capacitors being coupled together and being coupled to an input of the second m bit ADC and to a switch which facilitates the second terminals of the capacitors being selectively coupled to a reference voltage source; and
an output of the n bit ADC being adapted to provide n most significant bits of a digital output signal of the x bit ADC which is generated from an analog signal applied to the input terminal and the output of the m bit ADC being adapted to provide m least significant bits of the digital output signal of the x bit ADC where $n+m=x$.

16. The x bit analog-to-digital converter of claim 15 further comprising:
a second plurality of essentially identical capacitors each having first and second terminals and being equal in number to the number of comparators;
second control circuitry having inputs coupled to outputs of the comparators and being selectively responsive thereto, and having outputs coupled to first terminals of the second plurality of capacitors;
latch circuitry having inputs coupled to outputs of the bar code to binary circuitry;
delay and separation means, which has input thereof coupled to output terminals of the latch circuitry, for introducing delay to signals being processed therethrough and for generating first and second sets of output signals at first and second sets, respectively, of output terminals thereof;
a third m bit analog-to-digital converter (ADC);
second terminals of the second plurality of capacitors being coupled together and being coupled to an input of the third m bit analog-to-digital converter and to a second switch which facilitates the second terminals of the second plurality of capacitors being selectively coupled to the reference voltage source;

the first and second switches being adapted such that only one connects the second terminals of the capacitors coupled thereto to the reference voltage at a time; and first and second divide by two frequency circuits with inputs of each being coupled to a common clock terminal which is coupled to inputs of all of the comparators and with an output of each being coupled to an input of one of the first and second control circuitries and to one of the first and second switches.

17. The x bit analog-to-digital converter of claim 16 further comprising:

first and second error detection circuitries each having inputs and outputs;

the second and third ADCs both having an additional bit so as to have m+1 bits with the bar code to binary circuitry of each having m+1 outputs and each of the second and third ADCs further comprising an inverter having an input and an output and latch circuitry having m inputs and m outputs;

the first m−1 outputs of each bar code to binary circuitries being coupled to the respective first m−1 inputs of the latch circuitry associated therewith and the mth output of each bar code to binary circuitry being coupled to the input of the inverter associated therewith whose output is coupled to the m input of the latch circuitry associated therewith;

the m outputs of the latch circuits serving as two sets of m least significant output terminals of the x bit analog-to-digital converter;

the m and m+1 outputs of the second bar code to binary circuitry being coupled to inputs of the first error correction circuit;

the m and m+1 outputs of the third bar code to binary circuitry being coupled to inputs of the second error correction circuit; and each of the error correction circuits having a set of n outputs serve as output terminals of the x bit ADC and are the n most significant outputs of the x bit analog-to-digital convertor.

18. A twelve bit analog-to-digital converter (ADC) comprising:

a five bit analog-to-digital converter (ADC) comprising: thirty one sample and hold circuits each having an input coupled to an input terminal of the twelve bit ADC and each having an output; thirty one comparators each having first and second inputs, an output and a clock terminal, the first input of each comparator being coupled to an output of a separate one of the thirty one sample and hold circuits; a series combination of thirty two resistors with a common terminal of each pair of adjacent resistors being coupled to the second input of a separate one of the thirty one comparators; bar code to binary circuitry having thirty one inputs with each input being coupled to one of the outputs of a separate one of the thirty one comparators and having five outputs; and latch circuitry having five inputs with each being coupled to a separate one of the outputs of the bar code to binary circuitry and having five outputs;

digital delay circuitry having five inputs with each of same being coupled to a separate one of the five outputs of the latch circuitry of the five bit ADC;

error correction circuitry having seven inputs with each of the first five of the seven inputs being coupled to a separate one of the five outputs of the digital delay circuitry and having five outputs which are coupled to a separate one of five output terminals of the twelve bit ADC;

thirty one essentially identical capacitors each having first and second terminals;

control circuitry having thirty one inputs with each being coupled to an output of a separate one of the thirty one comparators of the five bit ADC, having a thirty second input terminal coupled to the input terminal of the twelve bit ADC, having a clock input terminal and having thirty one output terminals with each being coupled to a separate one of the first terminals of the thirty one capacitors;

switching circuitry having a first terminal coupled to the second terminals of the thirty one capacitors, having a second terminal which is connectable to a first reference voltage, having a clock input terminal, and being adapted to selectively, under control of a signal applied to the clock input terminal, couple the first and second terminals thereof together;

the control circuitry, under control of a signal applied to the clock input thereof, being adapted to selectively couple the input terminal of the twelve bit ADC to each of the first terminals of the thirty one capacitors while disabling the control circuitry from being responsive to signals on the outputs of the thirty one comparators of the five bit ADC, and to selectively allow the control circuitry to be responsive to signals on the outputs of the thirty one comparators of the five bit ADC and to cause each of the first terminals of the thirty one capacitors to be electrically isolated from the input terminal of the twelve bit ADC and to be coupled to one of a plurality of other reference voltages which are selected by the control circuitry which is selectively controlled by output signals of the thirty one comparators of the five bit ADC;

the switching circuitry being further adapted to selectively couple the first and second terminals thereof together while the input terminal of the twelve bit ADC is coupled to the first terminals of the thirty one capacitors and to selectively electrically isolate the first and second terminals thereof from each other when the control circuitry is responsive to signals on the outputs of the thirty one comparators of the five bit ADC; and an eight bit analog-to-digital converter (ADC), which has an input terminal coupled to the second terminals of the thirty one capacitors and which comprises: two hundred and fifty five sample and hold circuits each having an input coupled to the input of the eight bit ADC and each having an output; two hundred and fifty five comparators each having first and second inputs, an output and a clock terminal, the first input of each comparator being coupled to an output of a separate one of the two hundred and fifty five sample and hold circuits; a series combination of two hundred and fifty six resistors with a common terminal of each pair of adjacent resistors being coupled to the second input of a separate one of the two hundred and fifty five comparators; bar code to binary circuitry having two hundred and fifty five inputs with each input being coupled to one of the outputs of a separate one of the two hundred and fifty five comparators and having eight outputs; and latch circuitry having seven inputs with the first six inputs being coupled to a separate one of the outputs of the bar code to binary circuitry and having seven outputs; an inverter circuit having an input coupled to the seventh output of the bar code to binary circuitry and having an output coupled to the seventh input of the latch circuitry; the seven and eighth outputs of the bar code to binary circuitry being coupled to the sixth and seventh inputs, respectively, of the error correction circuitry; and the seven outputs of the latch circuitry being coupled to a separate one of sixth through twelve output terminals of the twelve bit ADC.

19. The twelve bit analog-to-digital convertor of claim 18 further comprising:
a high input impedance near unity gain buffer having an input coupled to the second terminals of each of the thirty one capacitors and having an output; and
an amplifier having an input coupled to the output of the buffer and having an output coupled to the input of the eight bit analog-to-digital converter.

20. An x bit analog-to-digital converter (ADC) comprising:
a sample and hold circuit having an input coupled to an input terminal of the x bit ADC and having an output;
an n bit analog-to-digital converter (ADC), where n is less than x, comprising a plurality of comparators each having a first input which is coupled to the output of the sample and hold circuit and further comprising a bar code to binary circuit having a separate input coupled to a separate output of each comparator and having n outputs which are coupled to n output terminals of the x bit ADC;
capacitive subtraction and sample and hold means coupled to outputs of the n bit ADC for selectively storing and holding the voltage of an analog signal applied to the input terminal of the x bit ADC and for subsequently subtracting from said voltage one voltage of a plurality of voltages which is determined by signals generated at outputs of the n bit ADC;
an m bit analog-to-digital convertor (ADC), where m is less than x, having an input terminal coupled to the capacitive subtraction means and having m outputs which are coupled to m output terminals of the x bit ADC; and
the n output terminals of the x bit ADC being adapted to provide n most significant bits of a digital output signal generated by the x bit analog-to-digital converter from an analog signal applied to the input terminal of the x bit ADC and the m output terminals of the x bit ADC be adapted to provide m least significant bits of the digital output signal of the x bit ADC where $n+m=x$.

21. A method of converting an analog signal to a digital representation thereof comprising the steps of:
selectively applying the analog signal to first terminals of a plurality of capacitors which have second terminals thereof selectively coupled to a fixed reference voltage to store the voltage level of a portion of the analog signal and applying the same analog signal to a first analog-to-digital converter which generates at least one most significant bit of a digital representation of the analog signal; and
coupling outputs of the first analog-to-digital converter to first control circuitry which, in response to signals received from the first analog-to-digital convertor, causes one of a group of preselected voltages to be coupled to each of the first terminals of the first plurality of capacitors while the second terminals thereof are allowed to electrically float in potential so as to cause a redistribution of charge stored in the first plurality of capacitors such that an analog signal is generated at the second terminals of the first plurality of capacitors which is the difference between the originally stored voltage level and the subsequently coupled voltages.

22. The method of claim 21 further comprising the steps of:
applying the analog signal to first terminals of a second plurality of capacitors which have second terminals thereof selectively coupled to a fixed reference voltage to store the voltage level of a selected portion(s) of the analog signal; and
coupling outputs of the first analog-to-digital converter to second control circuitry which, in response to signals received from the first analog-to-digital convertor, causes one of a group of preselected voltages to be coupled to each of the first terminals of the second plurality of capacitors while the second terminals thereof are allowed to electrically float in potential so as to cause a redistribution of charge stored in the second plurality of capacitors such that an analog signal is generated at the second terminals of the second plurality of capacitors which is the difference between the originally stored voltage level and the subsequently coupled voltages.

23. The method of claim 22 further comprising the step of coupling the second terminals of the first plurality of capacitors to a second analog-to-digital converter to generate at least one least significant bit of the digital representation of the analog signal and coupling the second terminals of the second plurality of capacitors to a third analog-to-digital converter to generate at least one least significant bit of the digital representation of the analog signal.

24. The method of claim 23 further comprising the step of separating outputs of the first analog-to-digital converter into first and second sets with the first set being adapted to receive at least one significant bit which corresponds to the a portion of the analog signal which is processed by the first plurality of capacitors and the second analog-to-digital converter and with the second set being adapted to receive at least one significant bit which corresponds to a portion of the analog signal which is processed by the second plurality of capacitors and the third analog-to-digital converter.

25. The method of claim 24 further comprising the step of applying a clock signal to a clock input of the first analog-to-digital converter and applying the same clock signal through first and second frequency dividers to clock inputs of the first and second control circuitries, respectively.

* * * * *